(12) United States Patent
Yu et al.

(10) Patent No.: US 11,342,188 B2
(45) Date of Patent: May 24, 2022

(54) METHODS FOR DOPING HIGH-K METAL GATES FOR TUNING THRESHOLD VOLTAGES

(71) Applicant: Taiwan Semiconductor Manufacturing Company, Ltd., Hsinchu (TW)

(72) Inventors: Kuo-Feng Yu, Zhudong Township (TW); Chun Hsiung Tsai, Xinpu Township (TW); Jian-Hao Chen, Hsinchu (TW); Hoong Shing Wong, Hsinchu (TW); Chih-Yu Hsu, Xinfeng Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/572,820

(22) Filed: Sep. 17, 2019

(65) Prior Publication Data
US 2021/0082706 A1    Mar. 18, 2021

(51) Int. Cl.
*H01L 21/28* (2006.01)
*H01L 21/8234* (2006.01)
(Continued)

(52) U.S. Cl.
CPC .... *H01L 21/28176* (2013.01); *H01L 21/0332* (2013.01); *H01L 21/28185* (2013.01);
(Continued)

(58) Field of Classification Search
CPC ..... H01L 21/823807; H01L 21/823821; H01L 21/823857; H01L 21/823842;
(Continued)

(56) References Cited

U.S. PATENT DOCUMENTS 6,251,804 B1    6/2001   Chen
6,821,901 B2 *  11/2004  Song .................. B81C 1/00087
                                                   257/E21.232
(Continued)

FOREIGN PATENT DOCUMENTS

KR    20070106161 A    11/2007
KR    20120012705 A     2/2012
(Continued)

*Primary Examiner* — Michael M Trinh
(74) *Attorney, Agent, or Firm* — Slater Matsil, LLP

(57) ABSTRACT

A method includes forming a first gate dielectric and a second gate dielectric over a first semiconductor region and a second semiconductor region, respectively, depositing a lanthanum-containing layer including a first portion and a second portion overlapping the first gate dielectric and the second gate dielectric, respectively, and depositing a hard mask including a first portion and a second portion overlapping the first portion and the second portion of the lanthanum-containing layer, respectively. The hard mask is free from both of titanium and tantalum. The method further includes forming a patterned etching mask to cover the first portion of the hard mask, with the second portion of the hard mask being exposed, removing the second portion of the hard mask and the second portion of the lanthanum-containing layer, and performing an anneal to drive lanthanum in the first portion of the lanthanum-containing layer into the first gate dielectric.

20 Claims, 28 Drawing Sheets

(51) Int. Cl.
*H01L 29/66* (2006.01)
*H01L 21/033* (2006.01)
*H01L 21/311* (2006.01)
*H01L 21/8238* (2006.01)
*H01L 27/092* (2006.01)

(52) U.S. Cl.
CPC .......... *H01L 21/31144* (2013.01); *H01L 21/823431* (2013.01); *H01L 21/823462* (2013.01); *H01L 21/823807* (2013.01); *H01L 27/0924* (2013.01); *H01L 29/66545* (2013.01); *H01L 29/66795* (2013.01)

(58) Field of Classification Search
CPC ....... H01L 21/823462; H01L 21/28185; H01L 21/28176; H01L 27/0924; H01L 21/02321; H01L 21/3115
See application file for complete search history.

(56) References Cited

U.S. PATENT DOCUMENTS

| | | | |
|---|---|---|---|
| 8,435,891 B2* | 5/2013 | Engel | ............... H01L 21/7681 438/667 |
| 9,824,930 B2 | 11/2017 | Ando et al. | |
| 10,304,835 B1* | 5/2019 | Tsai | ............... H01L 21/823857 |
| 2012/0032332 A1 | 2/2012 | Lim et al. | |
| 2012/0129327 A1 | 5/2012 | Lee | |
| 2013/0146953 A1 | 6/2013 | Cheng et al. | |
| 2015/0249015 A1* | 9/2015 | Ando | ............... H01L 29/7851 438/591 |
| 2016/0204215 A1 | 7/2016 | Chang et al. | |
| 2017/0236821 A1* | 8/2017 | Kim | ............... H01L 27/088 257/401 |
| 2019/0304846 A1* | 10/2019 | Lee | ............... H01L 21/31144 |

FOREIGN PATENT DOCUMENTS

| | | |
|---|---|---|
| KR | 20120055430 A | 5/2012 |
| KR | 20160086737 A | 7/2016 |

* cited by examiner

METHODS FOR DOPING HIGH-K METAL GATES FOR TUNING THRESHOLD VOLTAGES

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

Metal gates may include a plurality of layers, so that the different requirements of NMOS devices and PMOS devices can be met. The formation of metal gates typically involves removing dummy gate stacks to form trenches, depositing a plurality of metal layers extending into the trenches, forming metal regions to fill the remaining portions of the trenches, and then performing a Chemical Mechanical Polish (CMP) process to remove excess portions of the metal layers. The remaining portions of the metal layers and metal regions form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
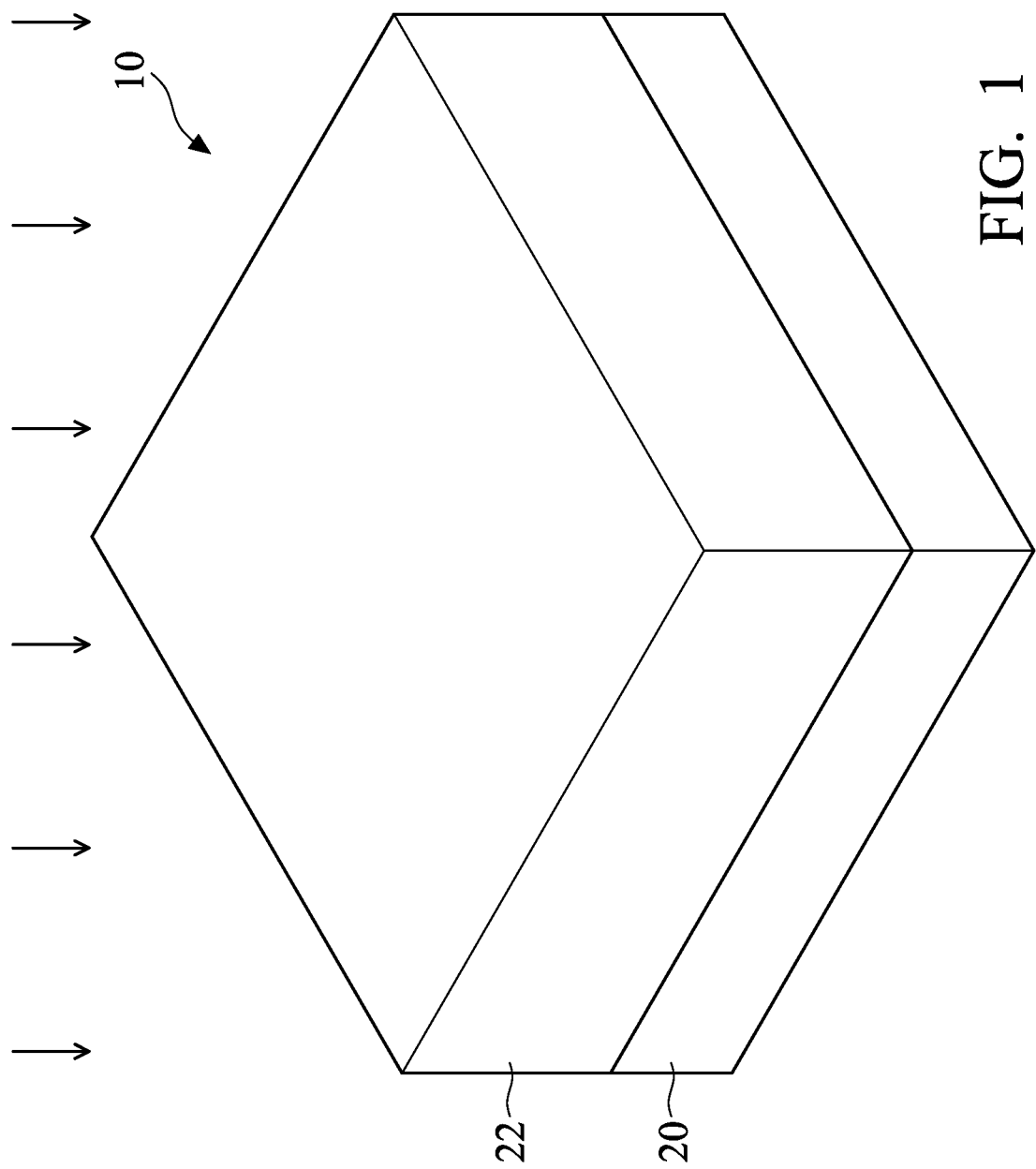
FIGS. 1-6, 7A, 7B, 8A, 8B, 9A, 9B, 10A, 10B, 11, 12, 13A, 13B, 14, 15, 16, 17A, and 17B illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The methods of tuning threshold voltages of transistors with high-k gate dielectrics are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors such as planar transistors and Gate-All-Around (GAA) transistors may also be formed adopting the concept of the present disclosure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed as being performed in a particular order, other method embodiments may be performed in any logical order.

In accordance with some embodiments of the present disclosure, a doping-metal-containing layer (which may comprise lanthanum as the doping metal) is formed to have portions on a first high-k dielectric layer in a first transistor region and a second high-k dielectric layer in a second transistor region. A hard mask, which may be a single-layer hard mask or a dual-layer hard mask, is formed. The hard mask is patterned, and is used to remove the doping-metal-containing layer from the second high-k dielectric layer, while the doping-metal-containing layer is left over the first high-k dielectric layer. The hard mask is then removed. An anneal process is performed to drive the doping metal in the doping-metal-containing layer into the first high-k dielectric layer, so that the threshold voltage of the first transistor is increased or decreased. The threshold voltage of the second transistor, without the doping metal doped into the second high-k dielectric layer, is not changed. Accordingly, the process selectively adjusts the threshold voltages of some transistors.

Figure 22:
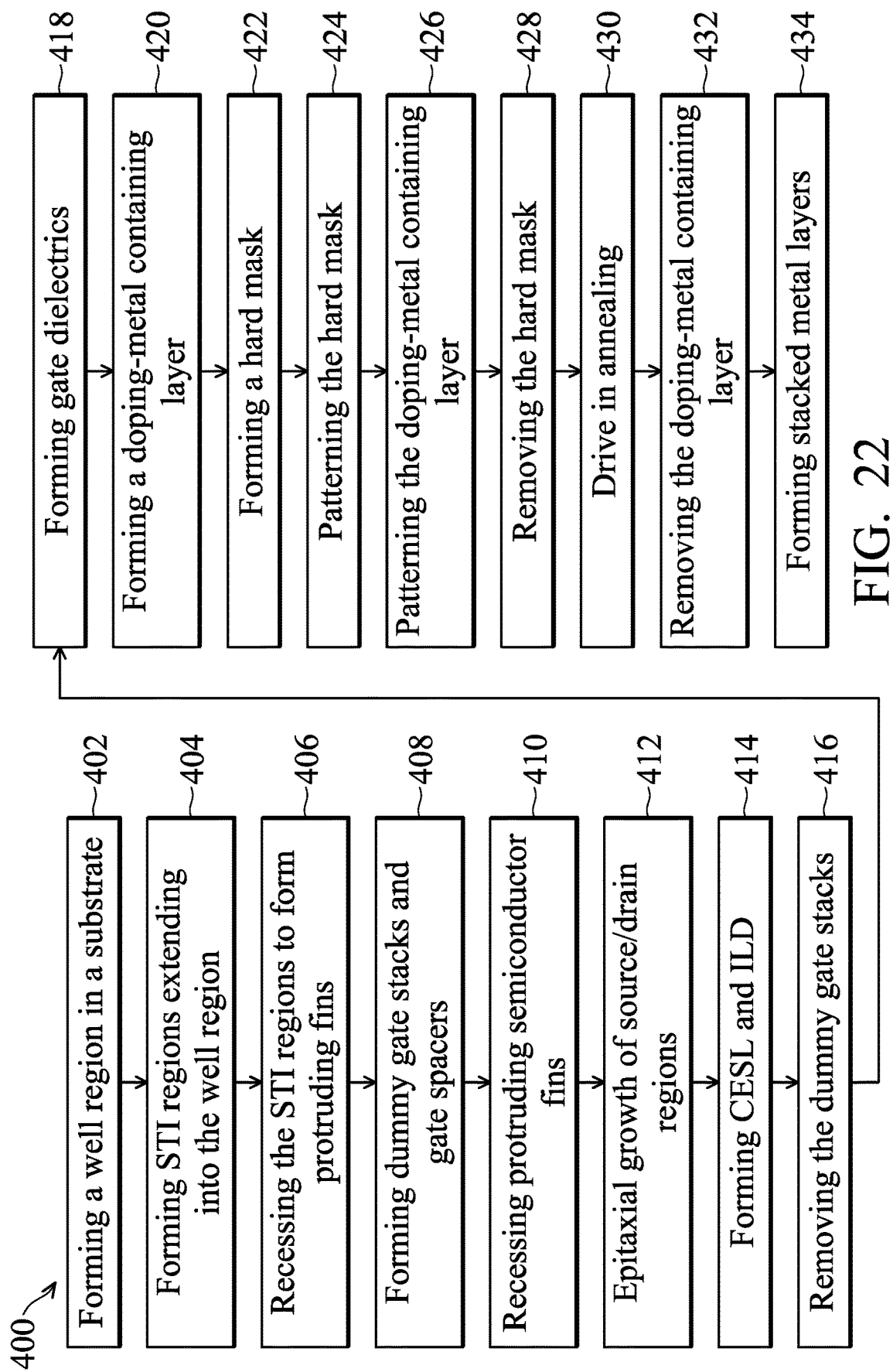
FIG. 22 illustrates a process flow for forming FinFETs in accordance with some embodiments.

FIGS. 1-6, 7A, 7B, 8A, 8B, 9A, 9B, 10A, 10B, 11, 12, 13A, 13B, 14, 15, 16, 17A, and 17B illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 shown in FIG. 22.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 shown in FIG. 22. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
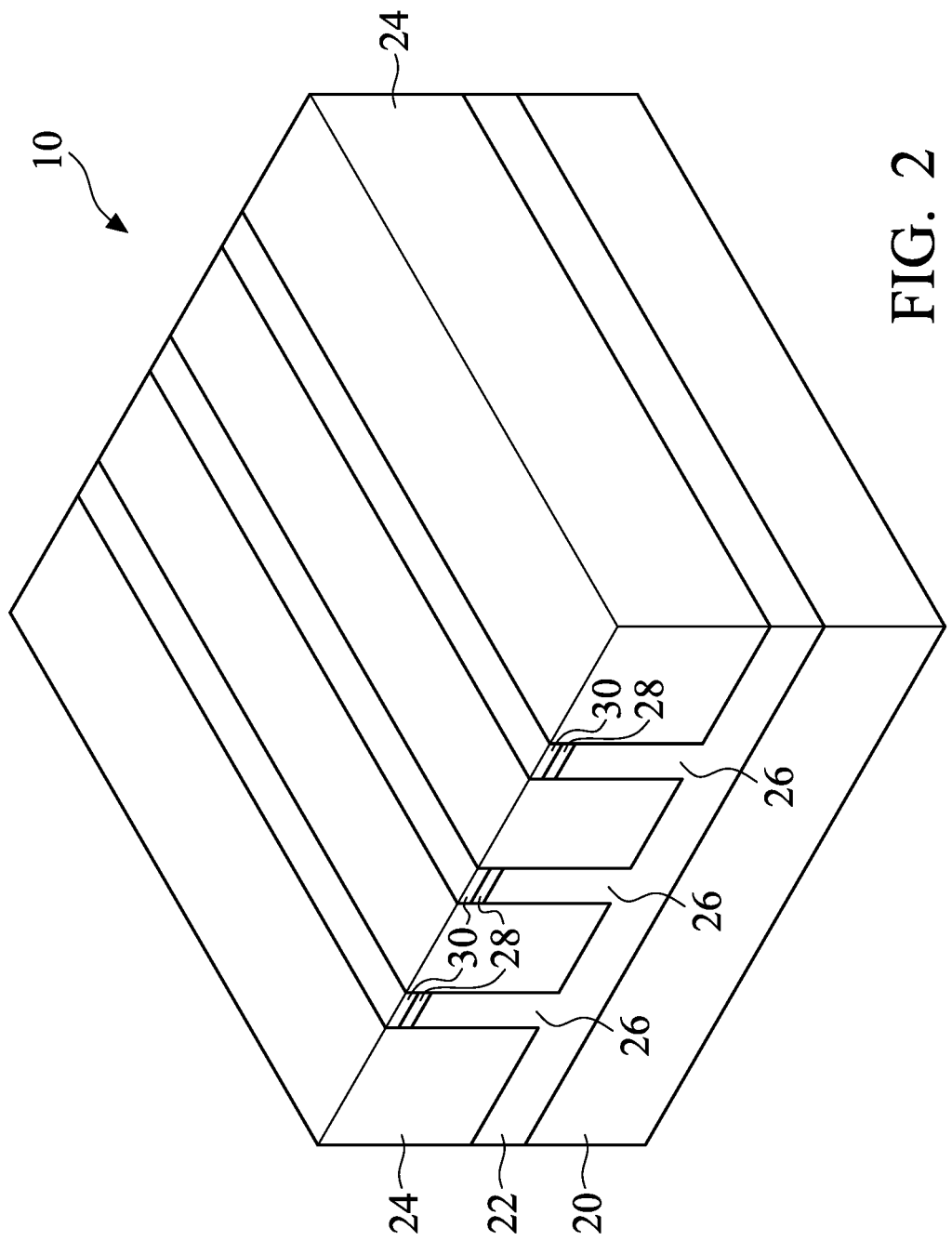

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 shown in FIG. 22. The portions of substrate 20 between neighboring STI regions 24 are referred to as semiconductor strips 26. To form STI regions 24, pad oxide layer 28 and hard mask layer 30 may be formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through the thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), Chemical Vapor Deposition (CVD), or the like. STI regions 24 also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard mask layers 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
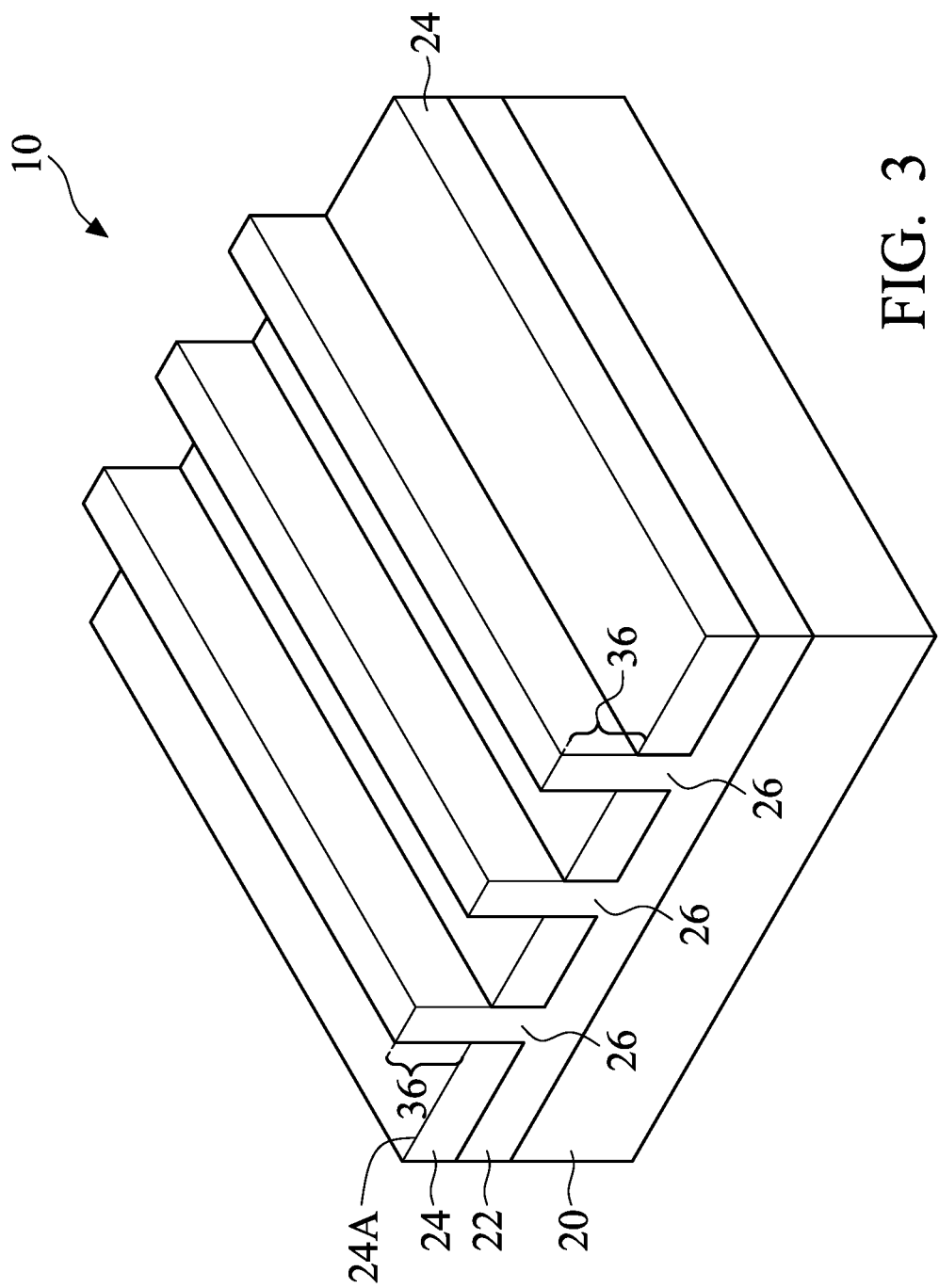

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 shown in FIG. 22. The etching may be performed using a dry etching process, wherein $HF_3$ and $NH_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
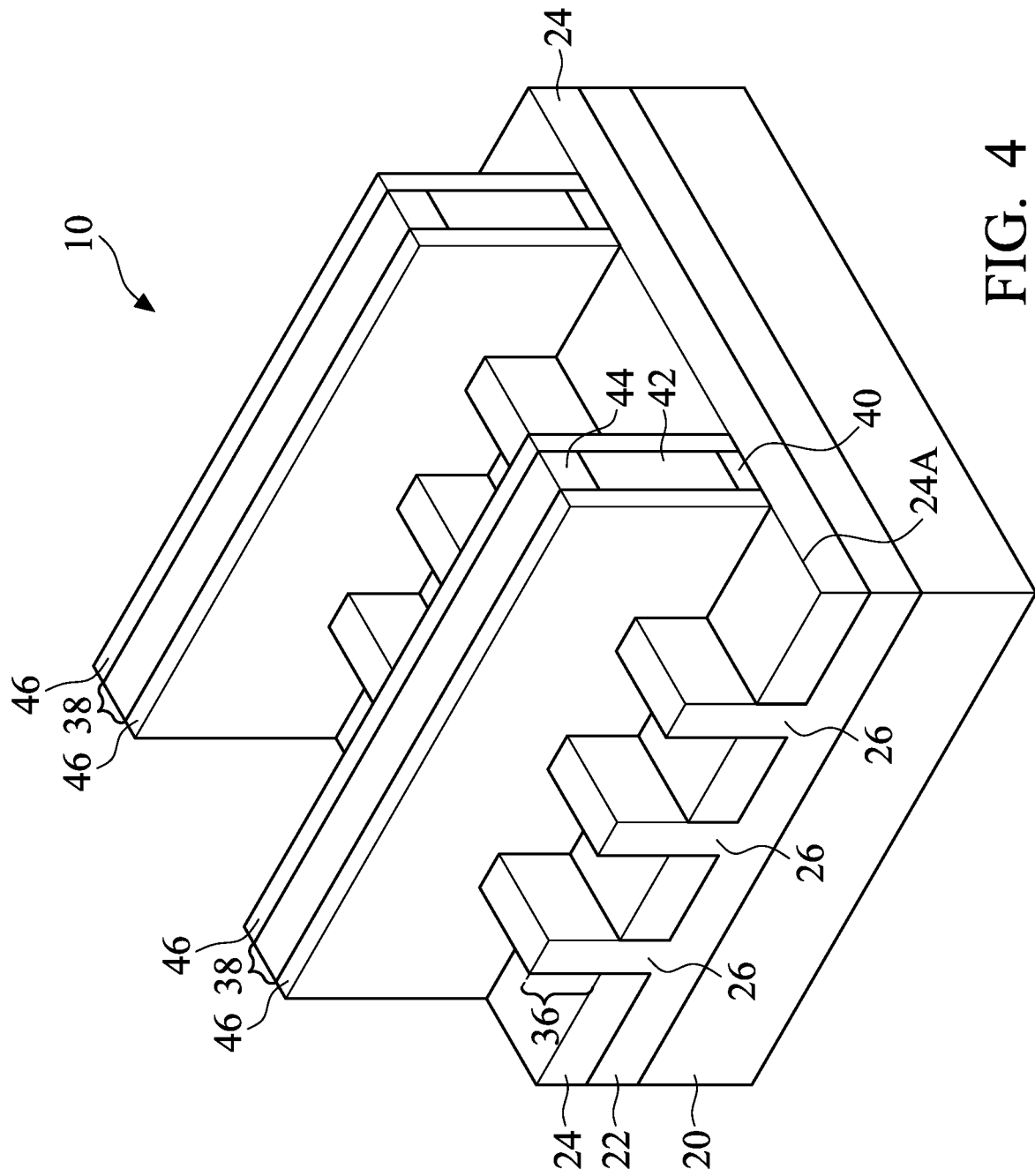

Referring to FIG. 4, dummy gate stacks 38 are formed to extend on the top surfaces and the sidewalls of (protruding) fins 36. The respective process is illustrated as process 408 in the process flow 400 shown in FIG. 22. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 shown in FIG. 22. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
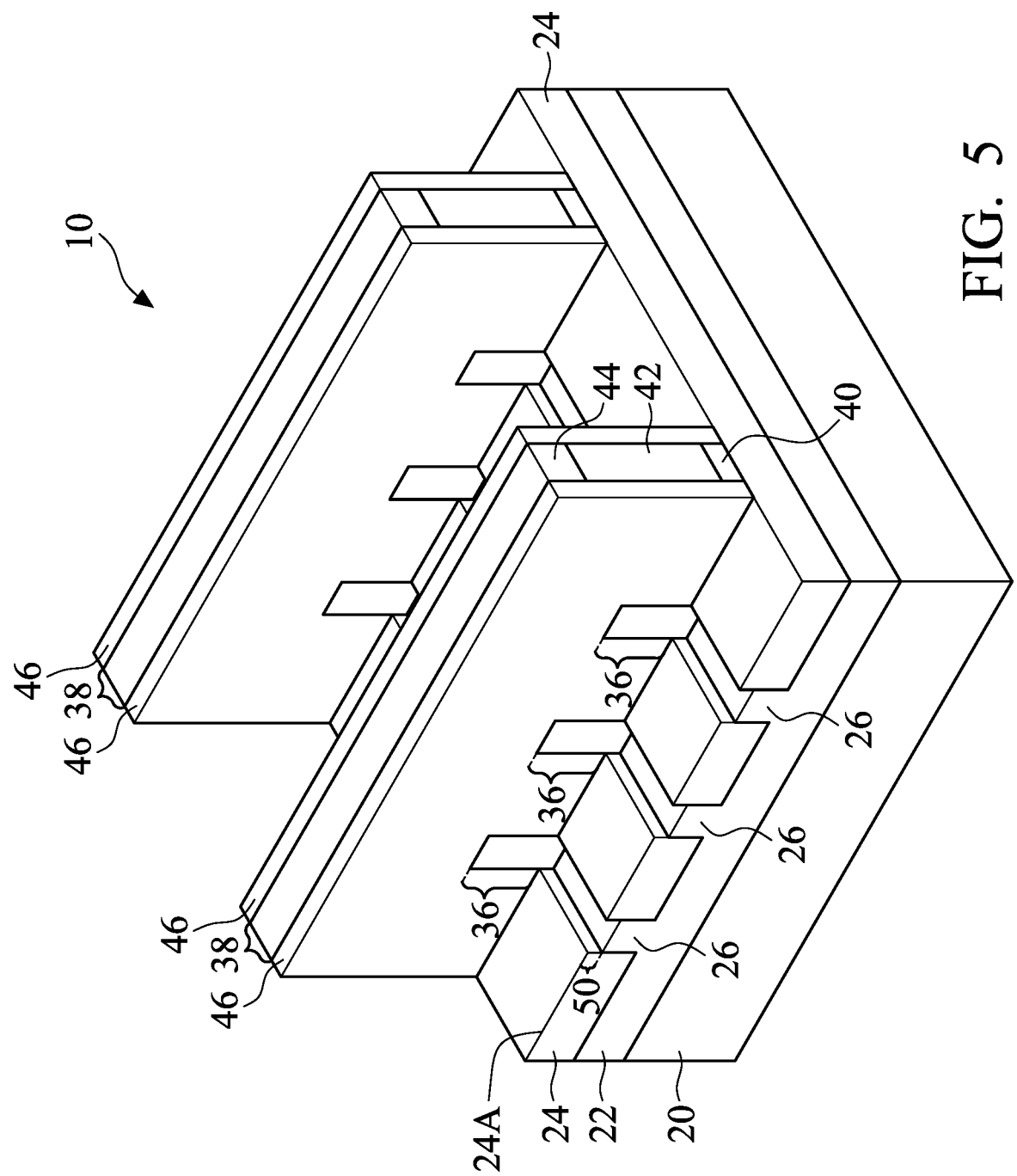

An etching process is then performed to etch the portions of protruding fins 36 that are not covered by dummy gate stacks 38 and gate spacers 46, resulting in the structure shown in FIG. 5. The respective process is illustrated as process 410 in the process flow 400 shown in FIG. 22. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
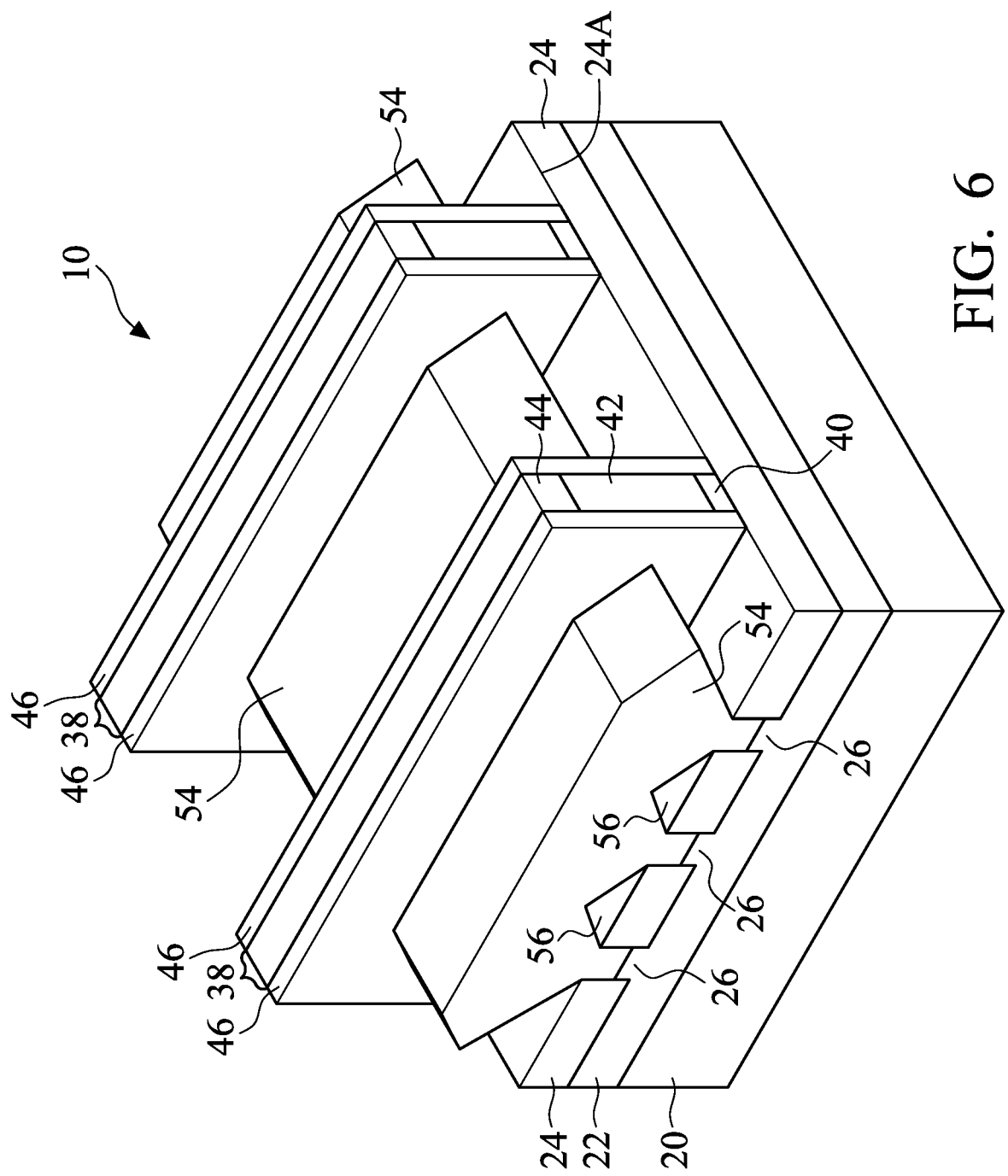

Next, epitaxy regions (source/drain regions) 54 are formed by selectively growing (through epitaxy) a semiconductor material in recesses 50, resulting in the structure in FIG. 6. The respective process is illustrated as process 412 in the process flow 400 shown in FIG. 22. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar, which is achieved by further growing on the epitaxy regions 54 as shown in FIG. 6.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
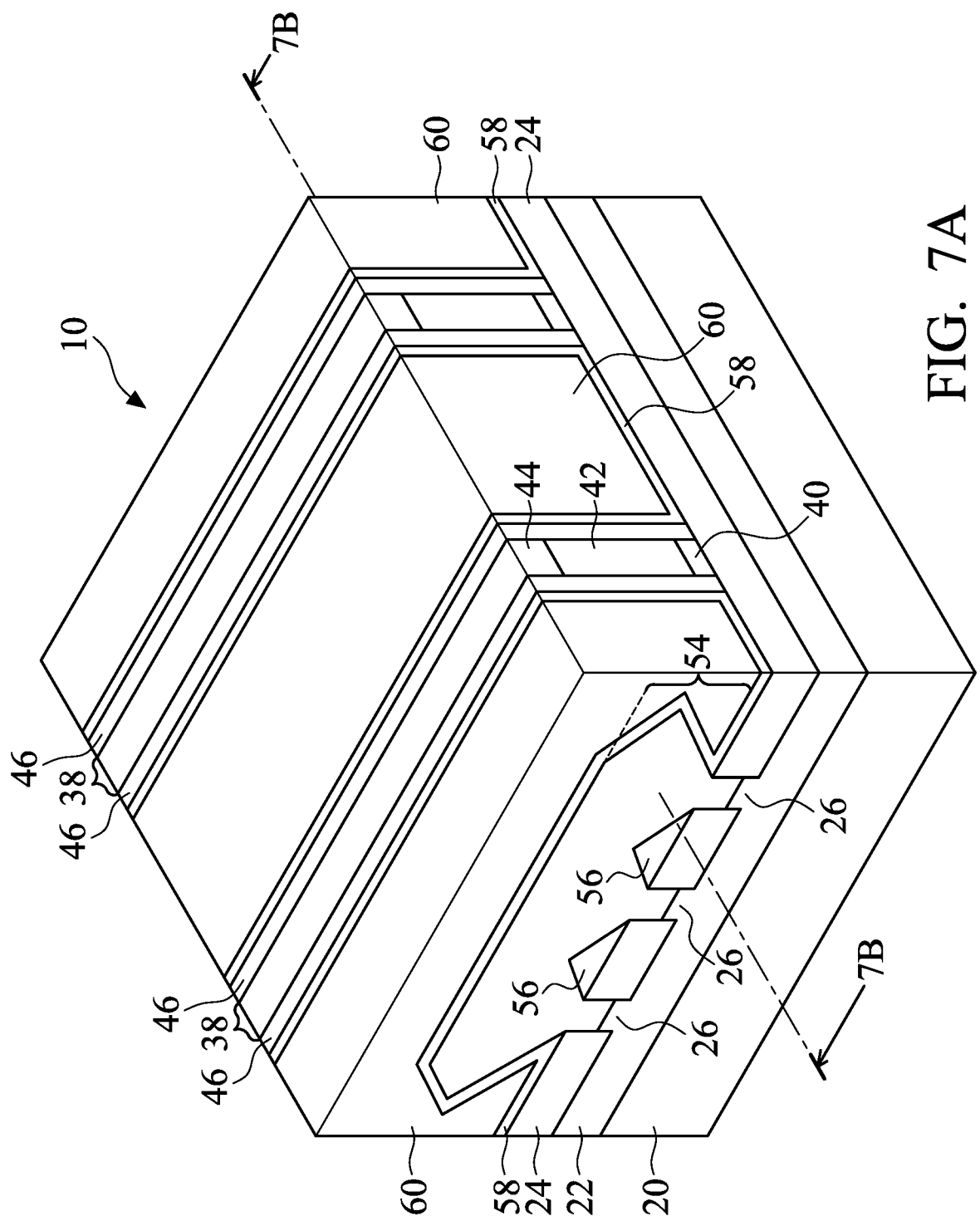

FIG. 7A illustrates a perspective view of the structure after the formation of Contact Etch Stop Layer (CESL) 58 and Inter-Layer Dielectric (ILD) 60. The respective process is illustrated as process 414 in the process flow 400 shown in FIG. 22. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
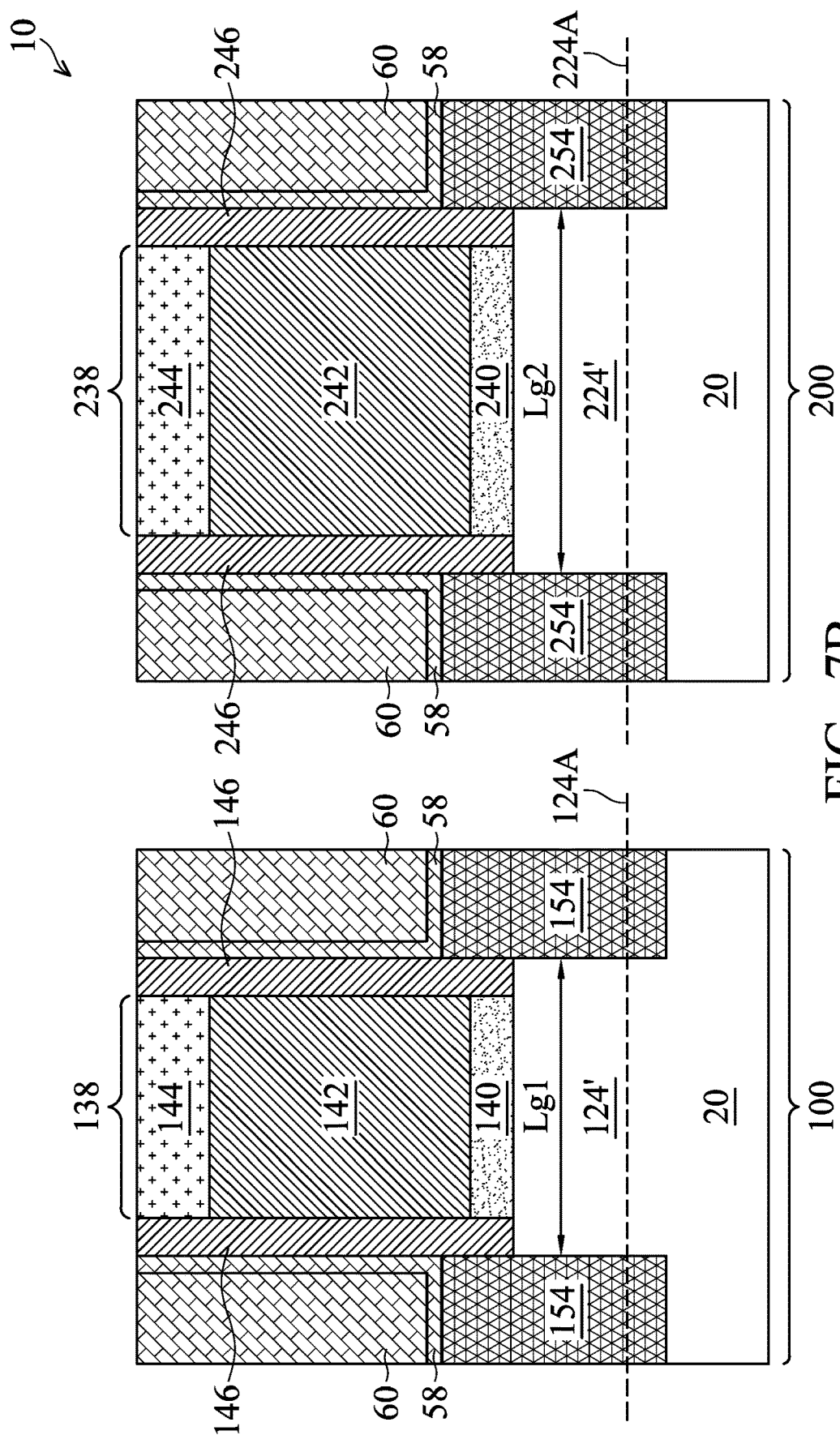

FIG. 7B illustrates the cross-sectional views of an intermediate structure in the formation of a first FinFET and a second FinFET (180 and 280 in FIG. 17A) on same substrate 20. It is appreciated that FinFETs are examples, and other types of transistors such as nano-sheet transistors, nano-wire transistors, planar transistors, gate-all-around transistors, or the like, may also be formed by applying the concept of the present disclosure. In accordance with some embodiments, the first FinFET and the second FinFET are formed in device region 100 and device region 200, respectively. In accordance with some embodiments, both FinFETs are n-type FinFETs. In accordance with alternative embodiments, both FinFETs are p-type FinFETs. In accordance with yet other embodiments, the first FinFET is an n-type FinFET and the second FinFET is a p-type FinFET, or the first FinFET is a p-type FinFET and the second FinFET is an n-type FinFET. The first FinFET and the second FinFET may have the same size, same stack of layers, or the like, or may be different from each other, for example, with different channel lengths (as shown in the illustrated example), different stack of layers, or the like. For example, the channel length of the first FinFET may be smaller than (as shown in the following examples) or greater than the channel length of the second FinFET. The cross-sectional view of either one of the first FinFET and the second FinFET may correspond to the cross-sectional view obtained from the vertical plane containing line 7B-7B in FIG. 7A.

To distinguish the features in the first FinFET from the features in the second FinFET, the features in the first FinFET in FIG. 7B may be represented using the reference numerals of the corresponding features in FIG. 7A plus number 100, and the features in the second FinFET in FIG. 7B may be represented using the reference numerals of the corresponding features in FIG. 7A plus number 200. For example, the source/drain regions 154 and 254 in FIG. 7B correspond to source/drain regions 54 in FIG. 7A, and the gate spacers 146 and 246 in FIG. 7B correspond to the gate spacers 46 in FIG. 7A. The corresponding features in the first FinFET and the second FinFET may be formed in common processes, with some of the example processes discussed in subsequent paragraphs, or may be formed in separate processes.

After the structure shown in FIGS. 7A and 7B is formed, the dummy gate stacks 138 and 238 are replaced with metal gates and replacement gate dielectrics, as shown in FIGS. 8A, 8B, 9A, 9B, 10A, 10B, 11, 12, 13A, 13B, 14, 15, 16, 17A and 17B. In these figures, the top surfaces 124A and 224A of STI regions 24 are illustrated, and semiconductor fins 124' and 224' protrude higher than top surfaces 124A and 224A, respectively.

Figure 8A:
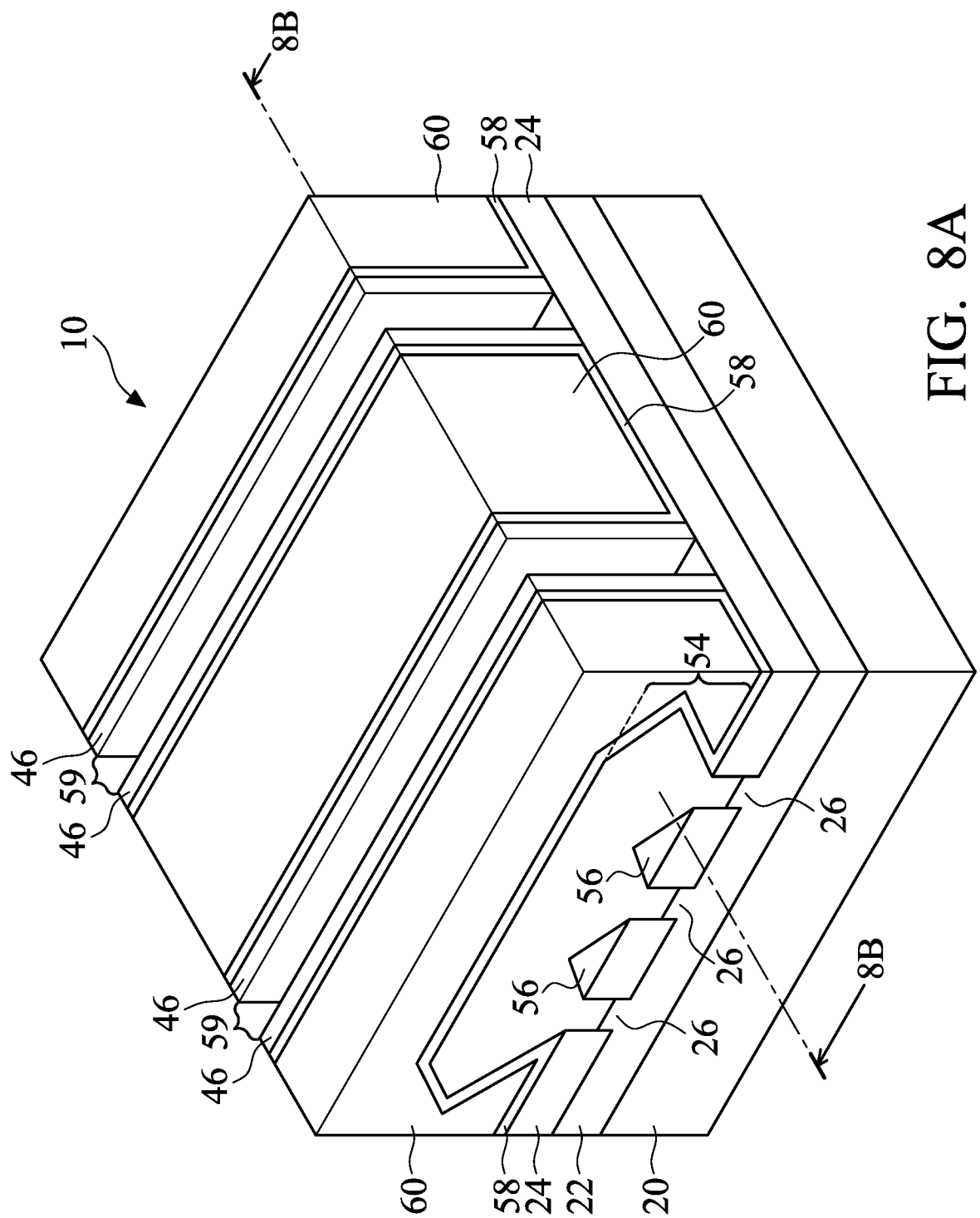
Figure 8B:
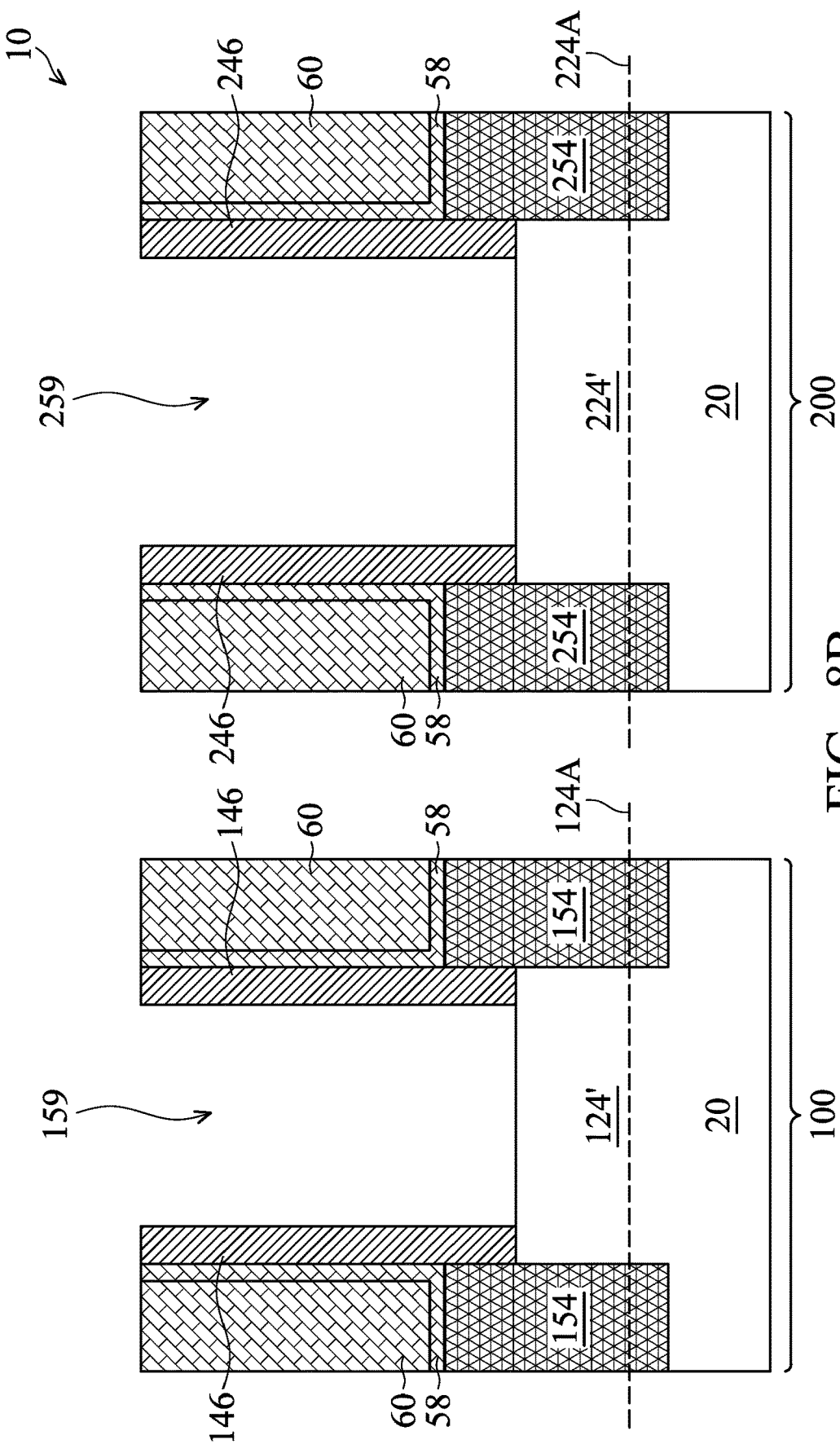

To form the replacement gates, hard mask layers 144 and 244, dummy gate electrodes 142 and 242, and dummy gate dielectrics 140 and 240 as shown in FIGS. 7A and 7B are removed first, forming trenches 59 as shown in FIG. 8A. The respective process is illustrated as process 416 in the process flow 400 shown in FIG. 22. Trenches 59 in FIG. 8A correspond to trench 159 in device region 100 and trench 259 in device region 200 in FIG. 8B. The top surfaces and the sidewalls of protruding fins 124' and 224' are exposed to trenches 159 and 259, respectively.

Figure 9A:
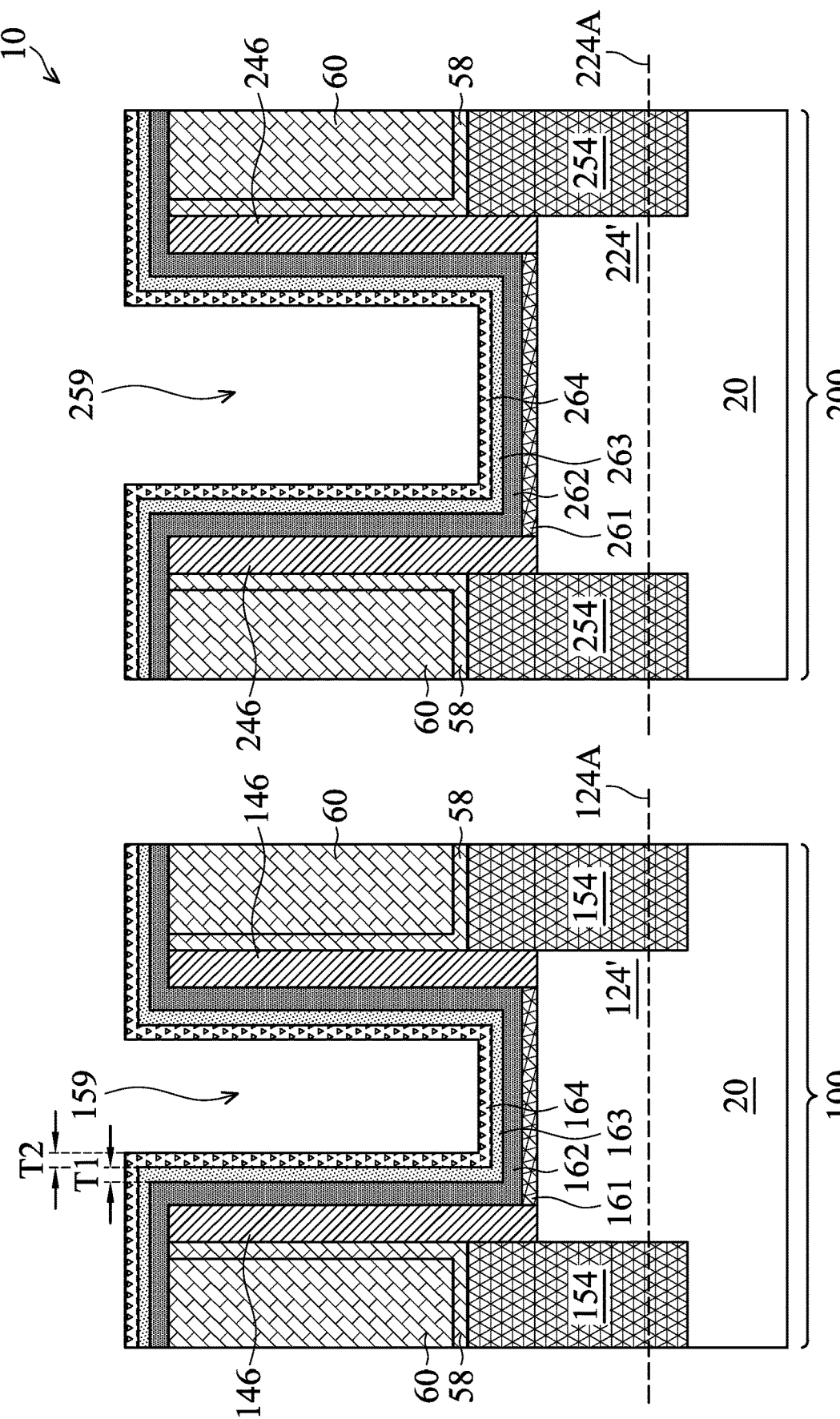

Next, referring to FIG. 9A, gate dielectrics 161/162 and 261/262 are formed, which extend into trenches 159 and 259, respectively. The respective process is illustrated as process 418 in the process flow 400 shown in FIG. 22. In accordance with some embodiments of the present disclosure, the gate dielectrics include Interfacial Layers (ILs) 161 and 261, which are formed on the exposed surfaces of protruding fins 124' and 224', respectively. ILs 161 and 261 may include an oxide layer such as a silicon oxide layer, which is formed through the thermal oxidation of protruding fins 124' and 224', a chemical oxidation process, or a deposition process. The gate dielectrics may also include high-k dielectric layers 162 and 262 over the corresponding ILs 161 and 261. High-k dielectric layers 162 and 262 may be formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layers 162 and 262 are overlying, and may contact, the respective underlying ILs 161 and 261. High-k dielectric layers 162 and 262 are formed as conformal layers, and extend on the sidewalls of protruding fins 124' and 224' and the top surface and the sidewalls of gate spacers 146 and 246, respectively. In accordance with some embodiments of the present disclosure, high-k dielectric layers 162 and 262 are formed using ALD or CVD. High-k dielectric layers 162 and 262 may be portions of the same dielectric layer, and are formed simultaneously using the same material and having the same thickness, or separately with different materials and/or different thicknesses.

FIG. 9A further illustrates the formation of doping-metal-containing layers 163 and 263, which may be (or may not be) formed in a common deposition process. The respective process is illustrated as process 420 in the process flow 400 shown in FIG. 22. Doping-metal-containing layers 163 and 263 comprise a metal, which, when doped into the underlying high-k dielectric layers 162 and/or 262, may cause the change (tuning) of threshold voltages of the corresponding FinFETs. In accordance with some embodiments, layers 163 and 263 comprise lanthanum, which may be in the form of lanthanum oxide ($La_2O_3$), $Al_2O_3$, $TiO_2$, or the like. Other metals or elements such as Pr, Pd, Ce, or the like, or alloys thereof may also be adopted. Doping-metal-containing layers 163 and 263 may be formed using a conformal deposition method such as Atomic Layer Deposition (ALD), Chemical Vapor Deposition (CVD), or the like. The thickness T1 of doping-metal-containing layer 163 may be in the range between about 1 Å and about 10 Å. It is realized that the thickness of doping-metal-containing layers 163 and 263 may generally be related to the intended threshold voltage tuning, and the greater the threshold voltage tuning is intended, the greater thickness T1 is.

FIG. 9A further illustrates the formation of hard masks 164 and 264, which are formed in a common deposition process. The respective process is illustrated as process 422 in the process flow 400 shown in FIG. 22. In accordance with some embodiments, hard masks 164 and 264 are single-layer hard masks formed of a homogenous material. The material of hard masks 164 and 264 is selected, so that it does not form hard intermixing layers with the underlying doping-metal-containing layers 163 and 263. For example, the material of hard masks 164 and 264 is free from titanium and tantalum. In accordance with some embodiments of the present disclosure, hard masks 164 and 264 are formed of or comprise aluminum nitride (AlN), zirconium oxide ($ZrO_2$), aluminum oxide ($Al_2O_3$), or the like. It is appreciated that these materials are stable, and are not prone to the diffusion into the underlying doping-metal-containing layers 163 and 263 and high-k dielectric layers 162 and 262. Furthermore, these materials have strong bonds, and are not prone to breaking into free metal atoms, oxygen atoms/molecules, and the like, and hence will not adversely affect the property of the underlying layers. Hard masks 164 and 264 may be formed using a conformal deposition method such as Atomic Layer Deposition (ALD), Chemical Vapor Deposition (CVD), or the like. The thickness T2 of hard masks 164 and 264 may be in the range between about 5 Å and about 25 Å.

Figure 10A:
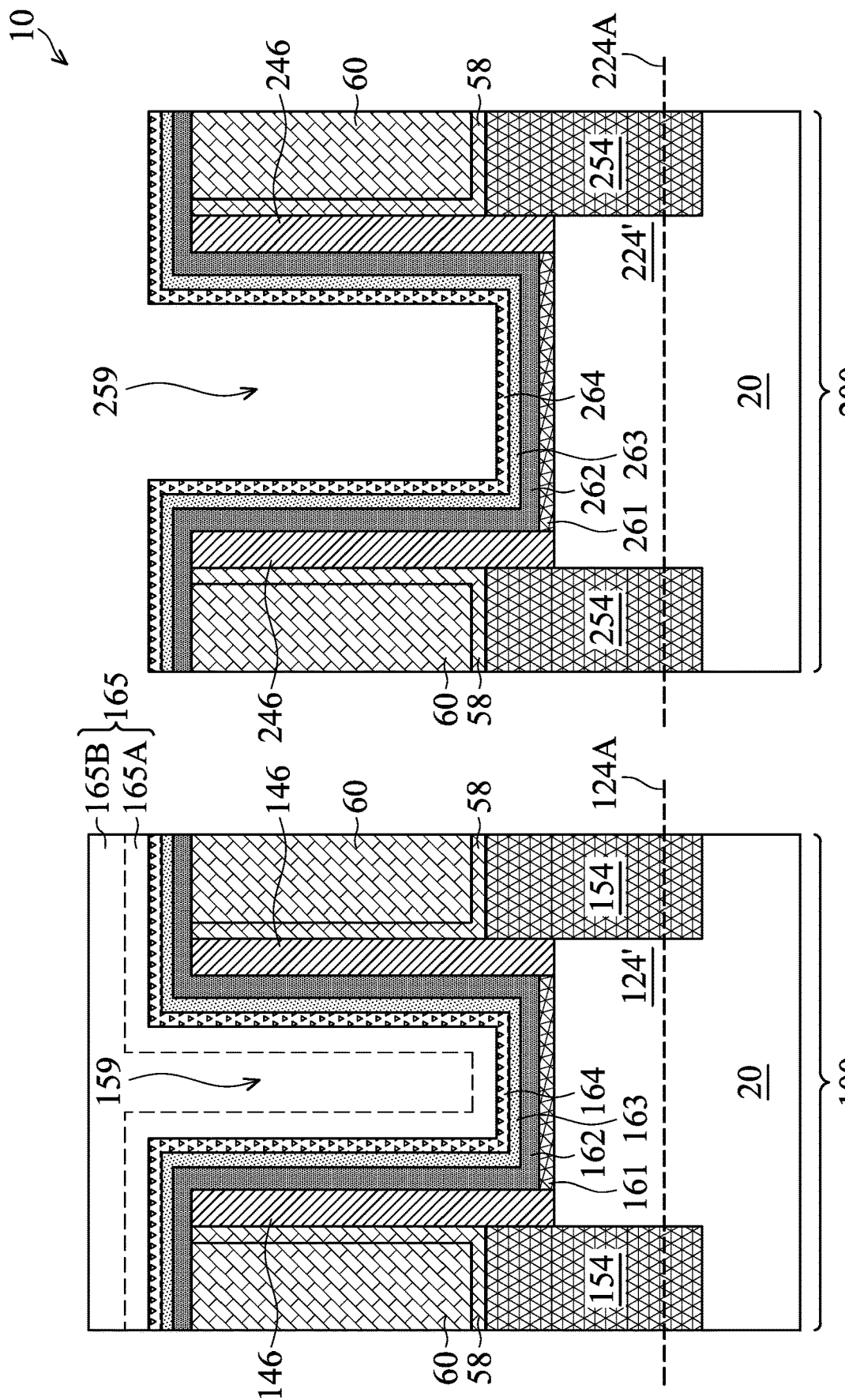
Figure 10B:
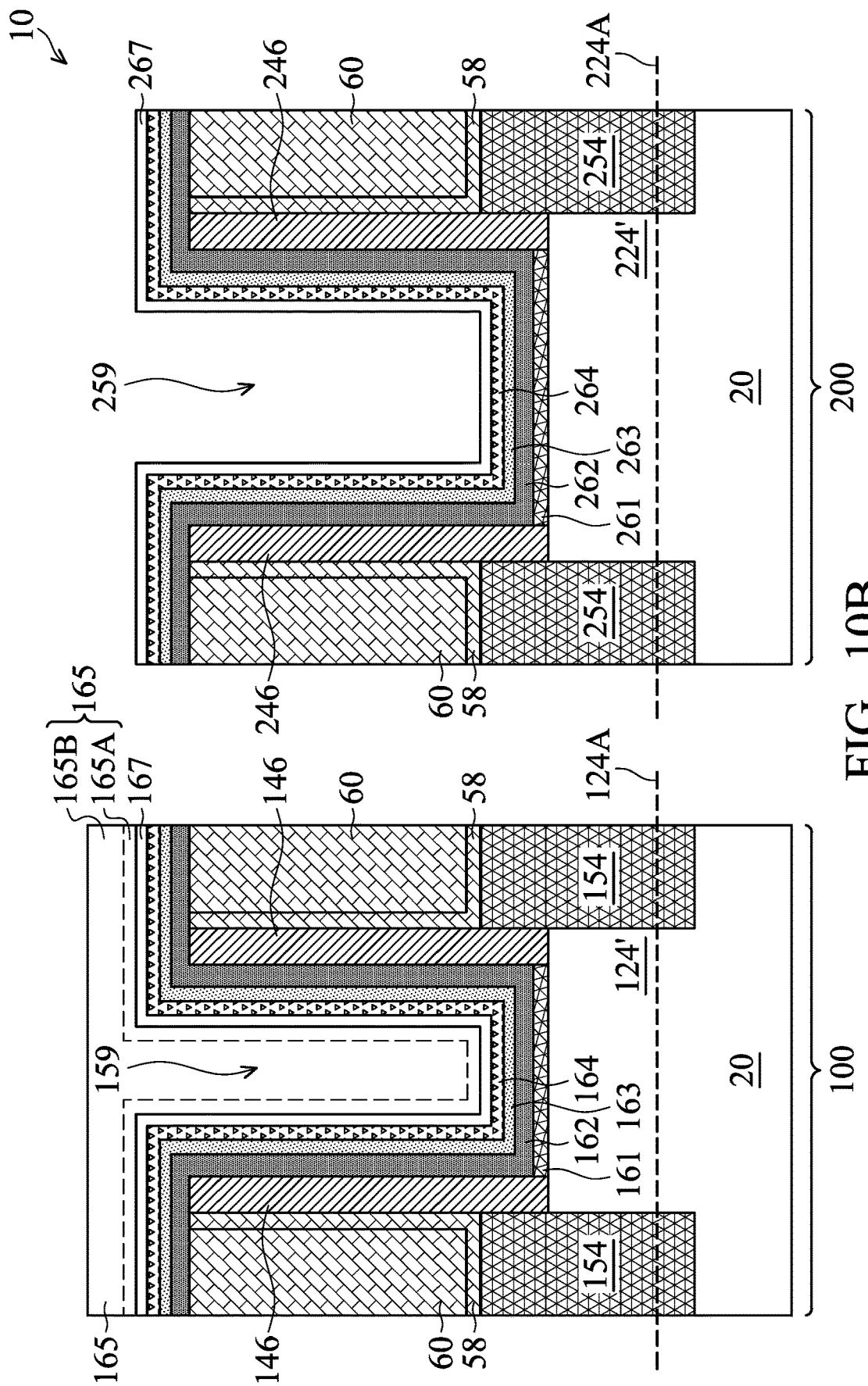

In accordance with some embodiments, after the formation of hard masks 164 and 264, a treatment is performed on hard masks 164 and 264. The treatment may improve the adhesion of hard masks 164 and 264 to the subsequently formed etching mask 165 (FIGS. 10A and 10B). In accordance with some embodiments, the treatment is performed in a plasma-containing environment, with nitrogen ($N_2$) or like gases being used as a process gas.

FIG. 10A illustrates the formation and the patterning of etching mask 165. Etching mask 165 may be formed to extend into both device regions 100 and 200, and then removed from device region 200 in a patterning process, which includes an exposure and development process. As a result, hard mask 264 is exposed, while hard mask 164 is covered by etching mask 165. In accordance with some embodiments, etching mask 165 includes Bottom Anti-Reflective Coating (BARC) 165A and photo resist 165B. It is appreciated that hard masks may be formed of materials (such as AlN, $Al_2O_3$, or $ZrO_2$) that may suffer from peeling with the overlying layer such as BARC 165A. To solve this problem, the material of the part of etching mask 165 over and contacting masks 164 and 264 is selected to reduce the peeling. It is found that when the contact angle (the angle formed when a droplet of the material is dropped on hard masks 164 and 264) is smaller than about 90 degrees, the peeling is eliminated. In accordance with some embodiments, the bottom part of etching mask 165 is formed of amorphous carbon, organo siloxane, TiN, SiN, SiON, or the like, so that the peeling between BARC 165A and hard masks 164 and 264 is eliminated. The adoption of a proper material for BARC 165A may eliminate the need of forming a second hard mask over hard masks 164 and 264 in order to improve the adhesion to etching mask 165. It is realized that although a second hard mask may have good adhesion with the overlying etching mask when some materials are used, the usable materials (for example, TiN, TaN, TiSiN, TiSiCN, or the like) often cause adverse effect on the underlying device, which will be discussed in subsequent paragraphs. Accordingly, in accordance with some embodiments, a single-layer hard mask is formed to eliminate these problems, and etching mask 165 is selected to solve the peeling problem.

In accordance with alternative embodiments, etching mask 165 is formed of a single photo resist or a tri-layer, which includes a bottom layer, a middle layer over the bottom layer, and a top layer over the middle layer. In accordance with alternative embodiments, etching mask 165 is a single photo resist layer. In accordance with yet alternative embodiments, etching mask 165 is a tri-layer mask including a bottom layer, a middle layer, and a top layer. The bottom layer and the top layer may be formed of photo resist.

The middle layer may be formed of an organic or an inorganic material. Accordingly, the material of the single photo resist or the bottom layer may be selected to have a small contact angle (for example, smaller than about 10 degrees), so that the peeling between etching mask 165 and the hard masks 164 and 264 is reduced.

Figure 11:
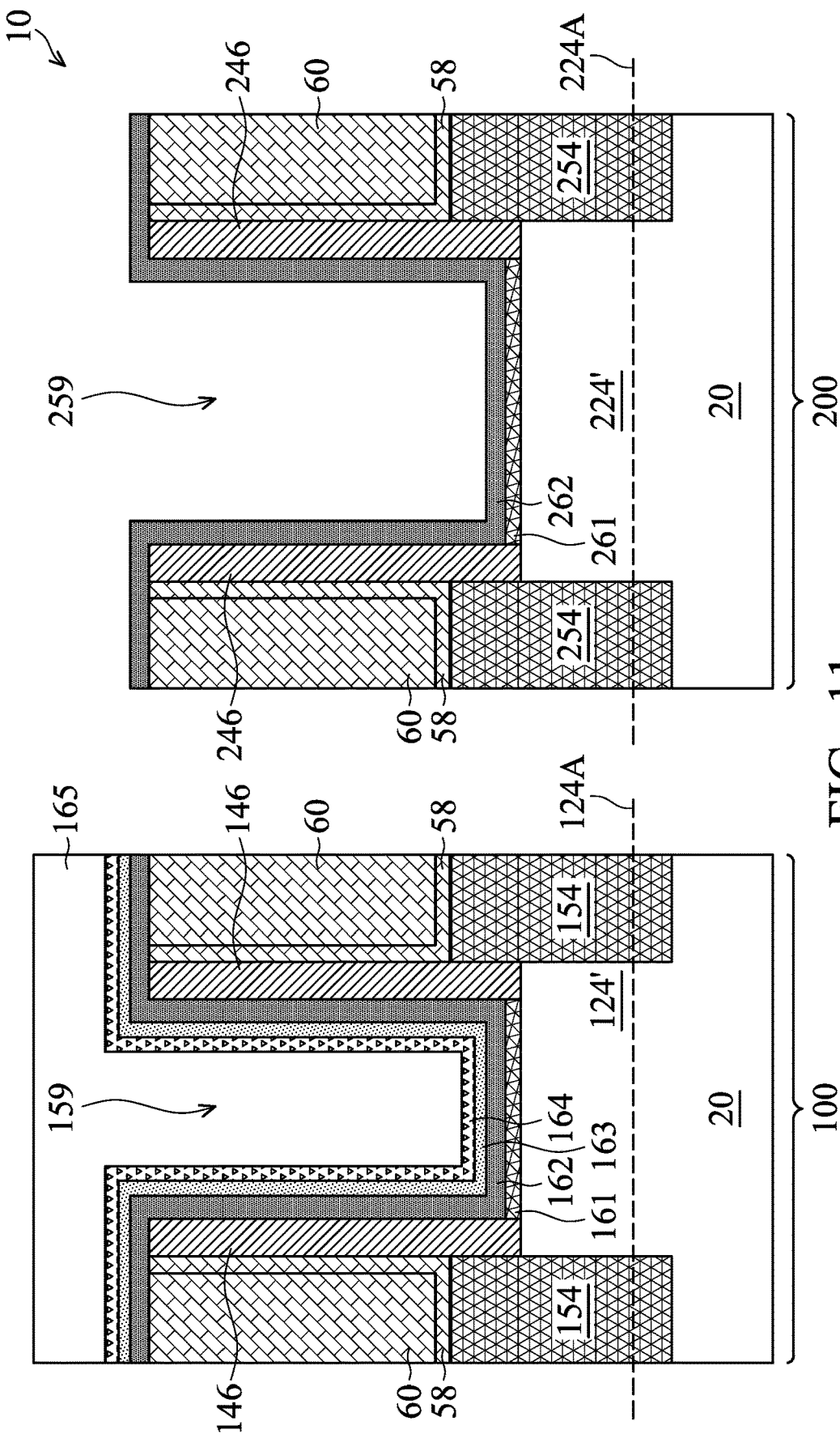

Hard mask 264 is then removed in an etching process. The respective process is illustrated as process 424 in the process flow 400 shown in FIG. 22. The resulting structure is shown in FIG. 11. Hard mask 164 is protected by etching mask 165, and remains after the etching process. The etching may be performed through a wet etching process. In accordance with some embodiments of the present disclosure, the etching is performed using a solution including ammonia dissolved in water ($NH_4OH$), TMAH, or the like. After the etching of hard mask 264, doping-metal-containing layer 263 is exposed.

The exposed doping-metal-containing layer 263 is then removed in an etching process. The respective process is illustrated as process 426 in the process flow 400 shown in FIG. 22. High-k dielectric layer 262 is exposed after the etching process. In accordance with some embodiments of the present disclosure, the etching of doping-metal-containing layer 263 is performed through a wet etching process. The etching chemical may include a chemical solution include hydrochloride (HCl) therein. The HCl solution is free from hydrogen peroxide ($H_2O_2$). Not including hydrogen peroxide in the HCl solution has two functions. Firstly, the etching of doping-metal-containing layer 263 causes the loss (the removal of the top portion) of high-k dielectric layer 262, and not including hydrogen peroxide in the HCl solution may reduce the loss of high-k dielectric layer 262. Secondly, not including hydrogen peroxide in the HCl results in more efficient removal of the doping-metal-containing layer 263. It is appreciated that the removal of both hard mask 264 and doping-metal-containing layer 263 is performed using the same etching mask 165. Hard mask 164, although not used as an etching mask for etching doping-metal-containing layer 263, has the function of controlling the etching width of doping-metal-containing layer 263 to prevent the over-etching of doping-metal-containing layer 263 in the lateral direction.

Figure 12:
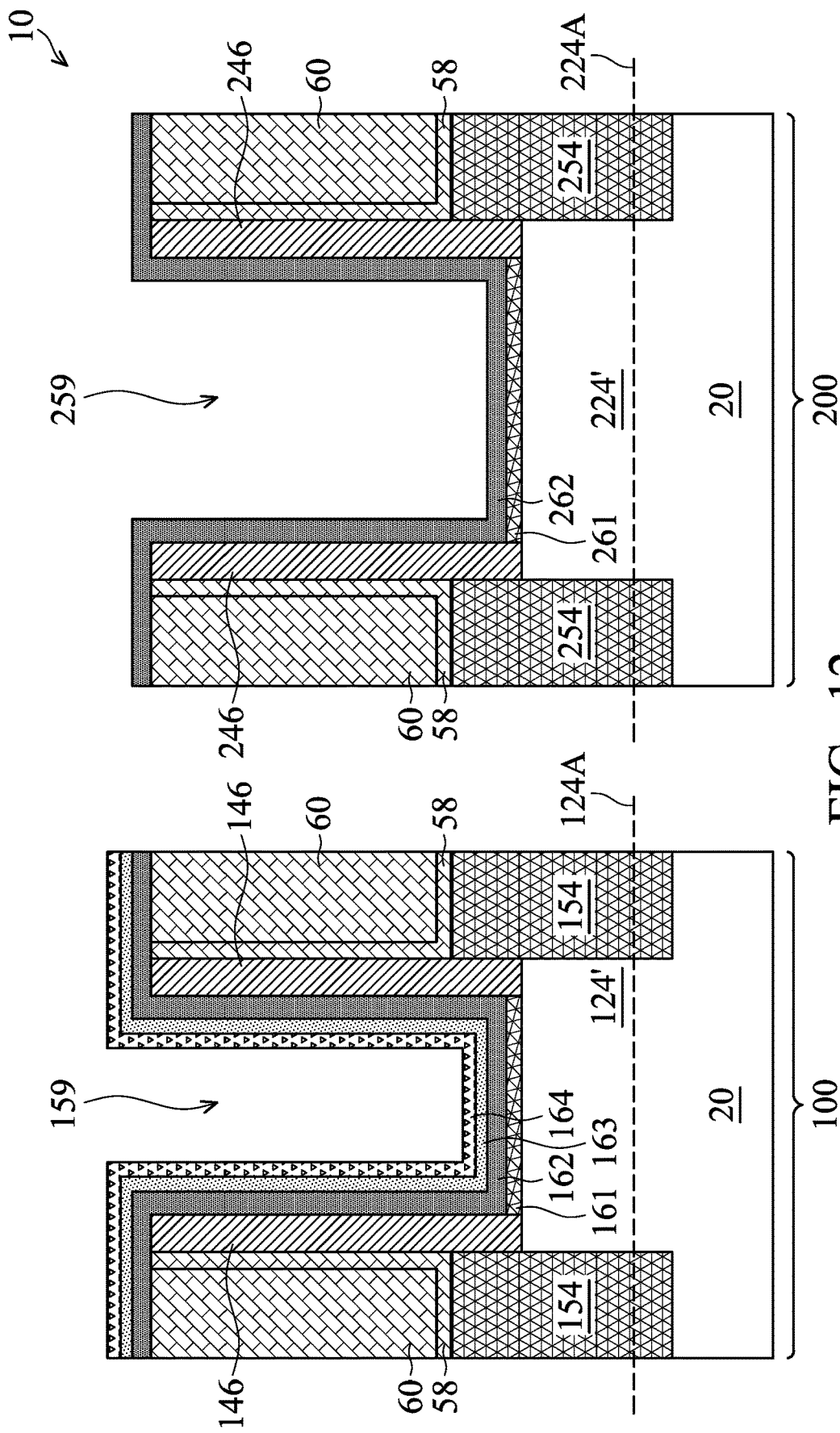

Next, etching mask 165 is removed. In accordance with some embodiments, etching mask 165 is removed in an ashing process, for example, using oxygen ($O_2$) as the process gas. The resulting structure is shown in FIG. 12. Hard mask 164 is accordingly exposed.

Figure 13A:
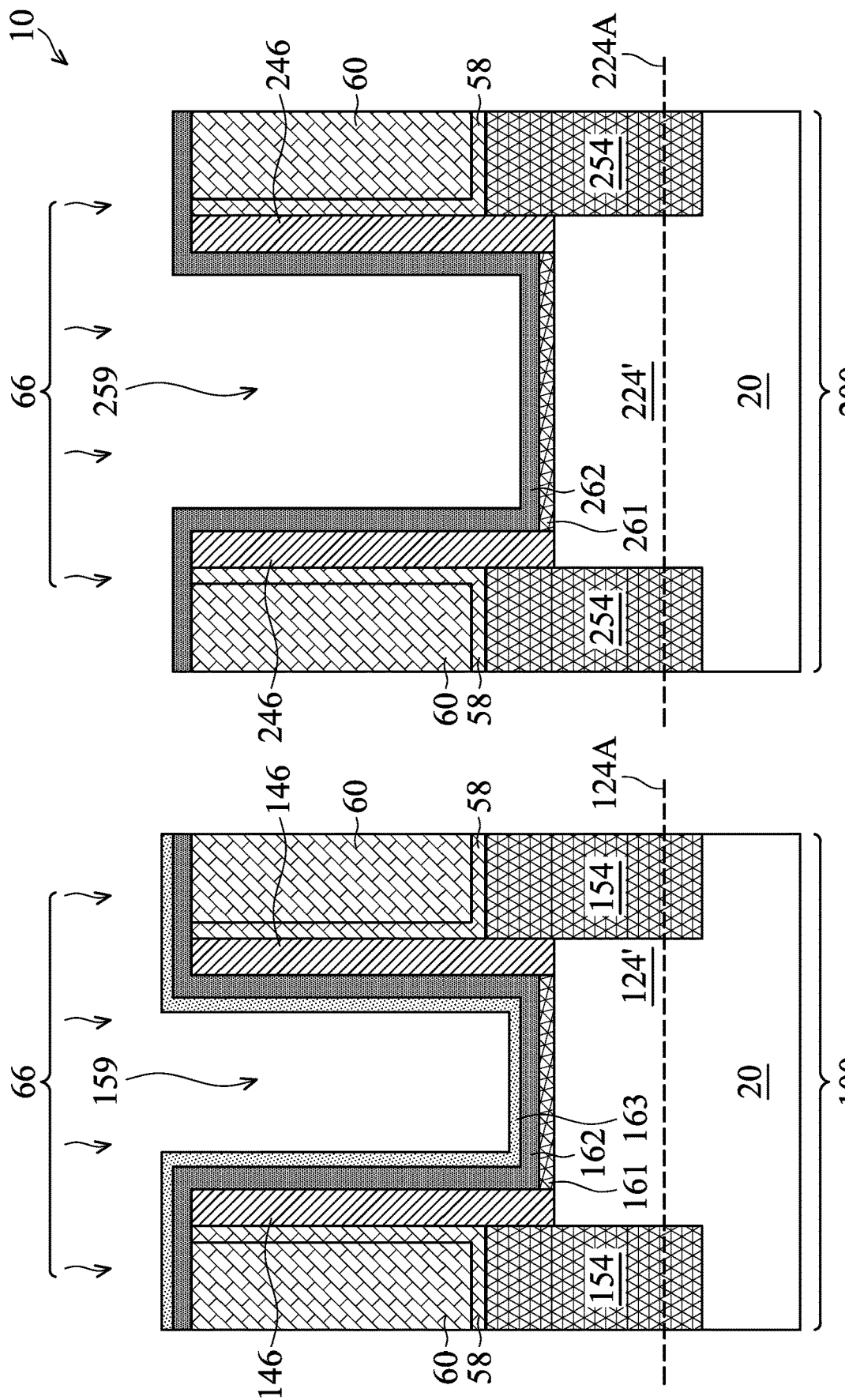

After the removal of etching mask 165, hard mask 164 is removed. The respective process is illustrated as process 428 in the process flow 400 shown in FIG. 22. The resulting structure is shown in FIG. 13A. In accordance with some embodiments of the present disclosure, the etching of hard mask 164 is performed through a wet etching process. The etching chemical may include a chemical solution including ammonia dissolved in (mixed with) a chemical solution, which chemical solution is sometimes referred to as Standard Clean 1 (SC1) solution. The SC1 solution may comprise $NH_4OH$, $H_2O_2$, and $H_2O$. Accordingly, the etching chemical may include additional ammonia added into the SC1 solution to increase the concentration of $NH_4OH$. After the removal of hard mask 164, doping-metal-containing layer 163 exists in device region 100, and is on high-k dielectric layer 162. In device region 200, there is no doping-metal-containing layer, and high-k dielectric layer 262 is exposed.

A drive-in anneal process (represented as arrows 66) is then performed. The respective process is illustrated as process 430 in the process flow 400 shown in FIG. 22. In accordance with some embodiments, the annealing process is performed using spike anneal, rapid thermal anneal, flash anneal, or the like. The annealing duration may be in the range between about 1.5 seconds and about 20 seconds. The annealing temperature may be in the range between about 570° C. and about 750° C.

As a result of the drive-in anneal process, the doping metal (for example, lanthanum) is driven into high-k dielectric layer 162, resulting in the tuning of the threshold voltage of the resulting transistor in device region 100. For example, when lanthanum is doped into high-k dielectric layer 162 and when the resulting FinFET is an n-type FinFET, the threshold voltage of the FinFET is reduced. Conversely, when lanthanum is doped into high-k dielectric layer 162 and when the resulting FinFET is a p-type FinFET, the threshold voltage of the FinFET is increased. The range of the tuning may be in the range between about 0 mV and about 150 mV, for example.

When the doping metal is driven into high-k dielectric layer 162 to tune the threshold voltage in the resulting FinFET 180 (FIG. 17A) in device region 100, the doping metal is not doped into high-k dielectric layer 262. Accordingly, the threshold voltage in the resulting FinFET 280 (FIG. 17A) in device region 200 is not tuned, and hence the tuning of the threshold voltage is selective. The range of tuning is related to the amount of lanthanum doped into high-k dielectric layer 162. For example, the range of tuning is related to the thickness of doping-metal-containing layer 163, and the thicker the doping-metal-containing layer 163 is, the greater the range of tuning may be resulted. Accordingly, different threshold voltages may be achieved through different thicknesses of doping-metal-containing layer 163. In accordance with some embodiments of the present disclosure, on a same device die/wafer, there may be three FinFETs to be formed. When the anneal process is performed, a first high-k dielectric layer for forming a first FinFET has a first doping-metal-containing layer thereon with a first thickness, a second high-k dielectric layer for forming a second FinFET has a second doping-metal-containing layer thereon with a second thickness smaller than the first thickness, and a third high-k dielectric layer for forming a third FinFET does not have doping-metal-containing layer thereon. As a result, through a common drive-in anneal process, the threshold voltage of the first FinFET may be tuned by a first value $\Delta Vt1$, the threshold voltage of the second FinFET may be tuned by a second value $\Delta Vt2$ smaller than the first value $\Delta Vt1$, and the threshold voltage of the third FinFET is not tuned. The three FinFETs may have identical structures, and through the threshold voltage tuning, their threshold voltages are distinguished from each other so that the three FinFETs may suit to the requirement of different circuits in the same device die.

Figure 14:
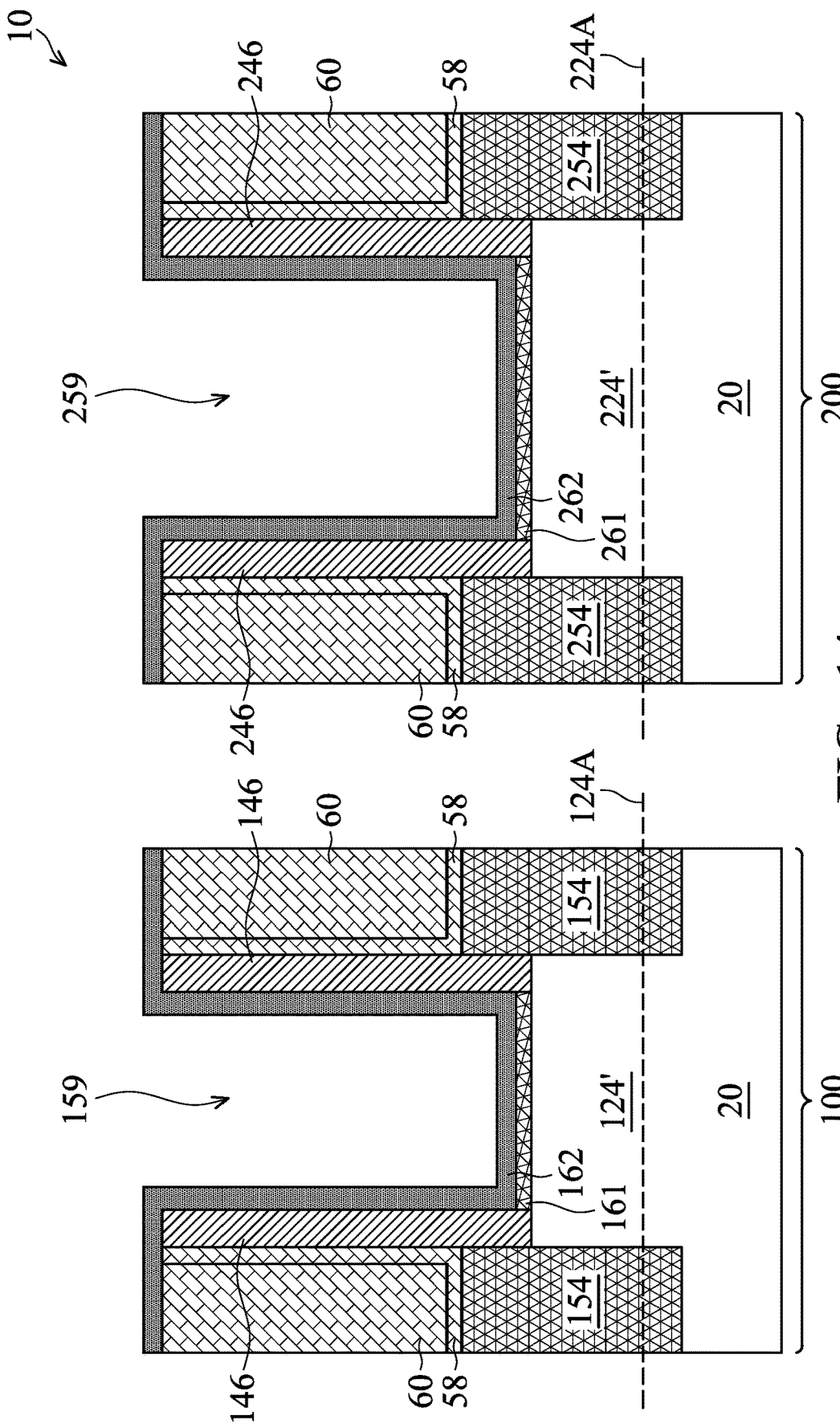

After the drive-in anneal process, the remaining doping-metal-containing layer 163 is removed in an etching process. The respective process is illustrated as process 432 in the process flow 400 shown in FIG. 22. The resulting structure is shown in FIG. 14. In accordance with some embodiments of the present disclosure, the etching of doping-metal-containing layer 163 is performed through a wet etching process. The etching chemical may include a chemical solution including ammonia and hydrochloride dissolved in water. The etching chemical is free from hydrogen peroxide ($H_2O_2$). Again, not including hydrogen peroxide in the HCl solution has two functions. Firstly, the etching of doping-metal-containing layer 263 causes the loss (the removal of the top portion) of high-k dielectric layers 162 and 262, and not including hydrogen peroxide in the HCl solution may reduce the loss. Secondly, not including hydrogen peroxide results in more efficient removal of the doping-metal-containing layer 163.

Figure 15:
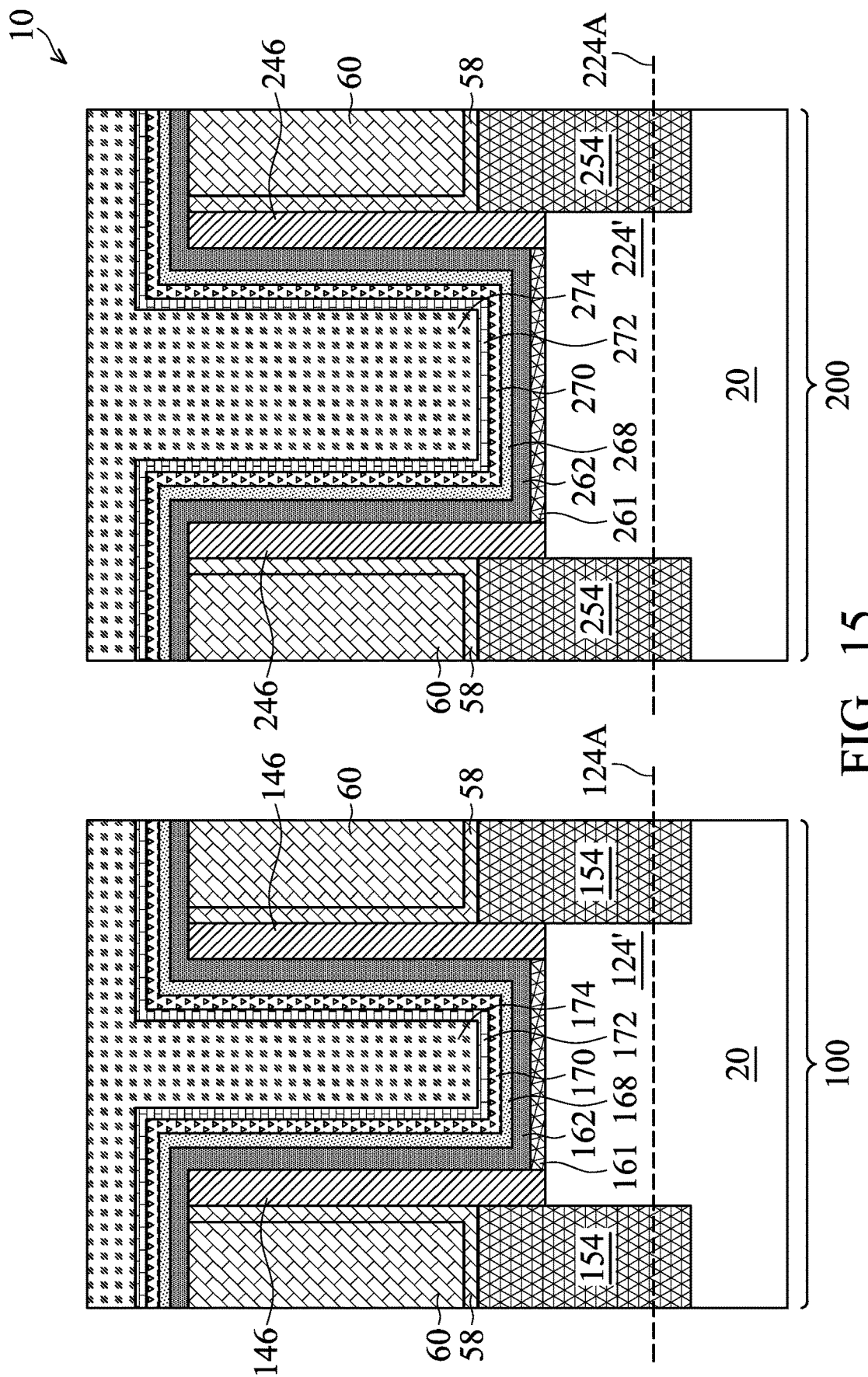

Next, a plurality of metal layers are formed over high-k dielectric layers 162 and 262 to fill trenches 159 and 259, respectively, and the resulting structure is shown in FIG. 15. The respective process is illustrated as process 434 in the process flow 400 shown in FIG. 22. It is appreciated that although FIG. 15 illustrates that similar layers are formed in device regions 100 and 200, the layer stacks in device regions 100 and 200 may be the same as each other or different from each other. For example, when the resulting FinFETs include a p-type FinFET and an n-type FinFET, the work function layers of the two FinFETs may be different from each other. The stacked layers in device region 100 may include diffusion barrier layer 168, work function layer 170 over diffusion barrier layer 168, capping layer 172 over work function layer 170, and filling metal region 174. The stacked layers in device region 200 may include diffusion barrier layer 268, work function layer 270 over diffusion barrier layer 268, capping layer 272 over work function layer 270, and filling metal region 274.

Diffusion barrier layer 168 and 268 may include TiN, TiSiN, or the like. The formation method may include ALD, CVD, or the like. Work-function layers 170 and 270 may be formed through ALD, CVD, or the like. Each of Work-function layers 170 and 270 may be a single layer having a homogenous composition (having same elements with same percentages of the same elements), or may include a plurality of sub-layers formed of different materials. Work-function layers 170 and 270 may include work-function metals that are selected according to whether the respective FinFETs formed in device regions 100 and 200 are n-type FinFETs or p-type FinFETs. For example, when the FinFET is an n-type FinFET, the corresponding work-function layer 170 or 270 may include an aluminum-based layer (formed of or comprising, for example, TiAl, TiAlN, TiAlC, TaAlN, or TaAlC). When the FinFET is a p-type FinFET, the corresponding work-function layer 170 or 270 may include a TiN layer, a TaN layer, and another TiN layer.

Capping layers 172 and 272 (which are also referred to as blocking layers) are formed conformally and extending into device regions 100 and 200. In accordance with some embodiments, capping layers 172 and 272 comprise TiN, TaN, or the like deposited by ALD, CVD or the like.

FIG. 15 also illustrates the formation of filling-metal regions 174 and 274. In accordance with some embodiments, filling-metal regions 174 and 274 are formed of tungsten, cobalt, or the like, which may be deposited using ALD, CVD, or combinations thereof.

Figure 16:
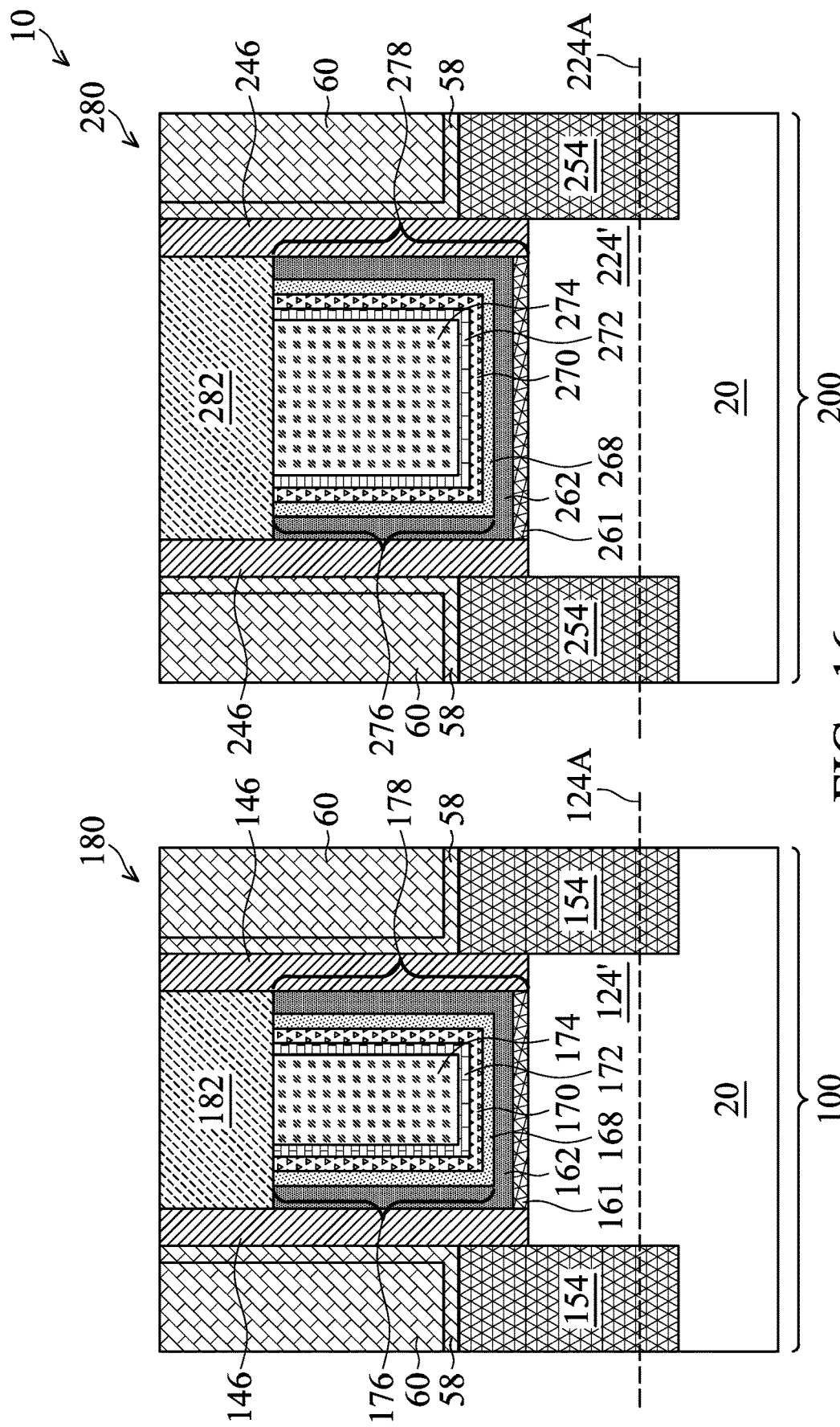

After the formation of filling-metal regions 174 and 274, a planarization process is performed to remove excess portions of the plurality of layers, resulting in the gate stacks 178 and 278 as shown in FIG. 16. Gate stacks 178 and 278 include gate electrodes 176 and 276, respectively.

FIG. 16 further illustrates the formation of hard masks 182 and 282 in accordance with some embodiments, which may include performing an etching process to recess gate stacks 178 and 278, so that recesses are formed between gate spacers 46, filling the recesses with a dielectric material, and then performing a planarization process to remove excess portions of the dielectric material. Hard masks 182 and 282 may be formed of silicon nitride, silicon oxynitride, silicon oxy-carbo-nitride, or the like. FinFETs 180 and 280 are thus formed.

Figure 17A:
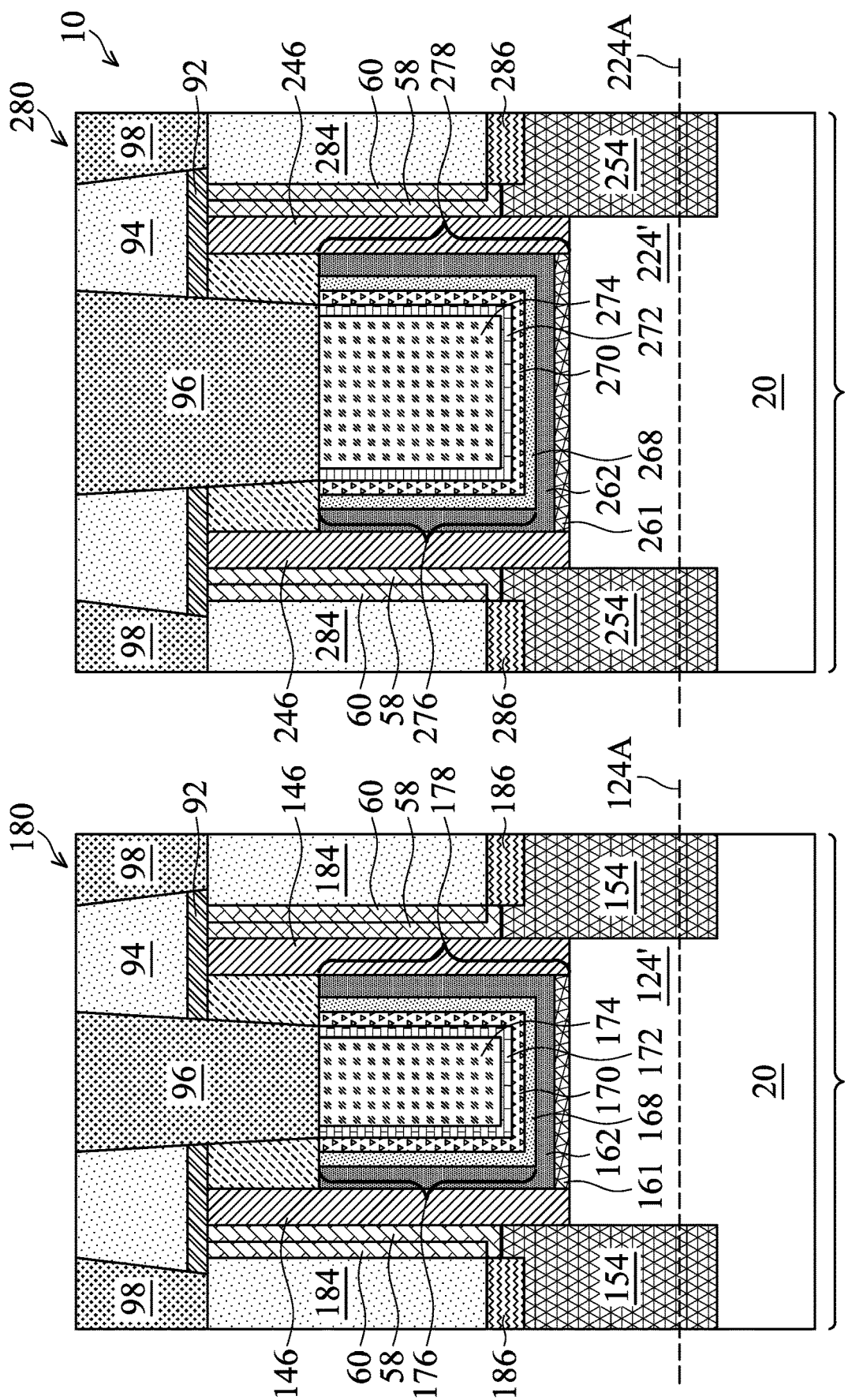

FIG. 17A illustrates the formation of source/drain contact plugs 184 and 284 and silicide regions 186 and 286. The formation of source/drain contact plugs 184 and 284 include etching ILD 60 to expose the underlying portions of CESL 58, and then etching the exposed portions of CESL 58 to form contact openings, through which source/drain regions 154 and 254 are revealed. In a subsequent process, a metal layer (such as a Ti layer) is deposited to extend into the contact openings, followed by the formation of a metal nitride capping layer. An anneal process is then performed to react the metal layer with the top portion of source/drain regions 154 and 254 to form silicide regions 186 and 286, respectively. A filling-metallic material such as tungsten, cobalt, or the like, is then filled into the contact openings, followed by a planarization process, resulting in source/drain contact plugs 184 and 284. Etch stop layer 92 and ILD 94 may then be deposited. Gate contact plugs 96 are also formed to penetrate through hard masks 182 and 282 to contact gate electrodes 176 and 276, respectively. Source/drain contact plugs 98 are also formed.

Figure 17B:
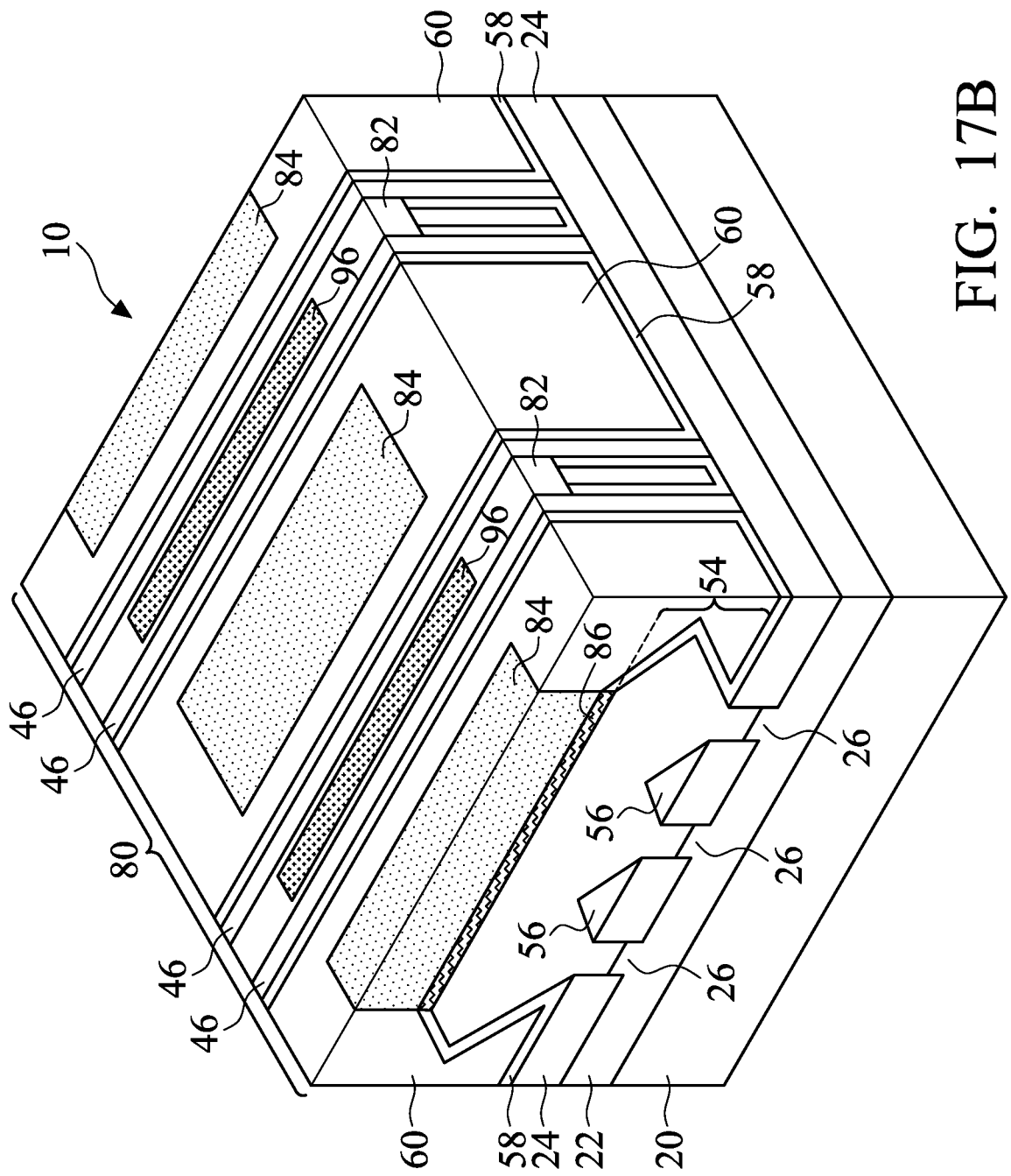

FIG. 17B illustrates a perspective view of a FinFET 80, which may represent either one of FinFETs 180 and 280 as shown in FIG. 17A. Gate contact plug 96, source/drain silicide regions 86 (representing 186 and 286), and source/drain contact plugs 84 (representing 184 and 284) are also illustrated.

Figure 9B:
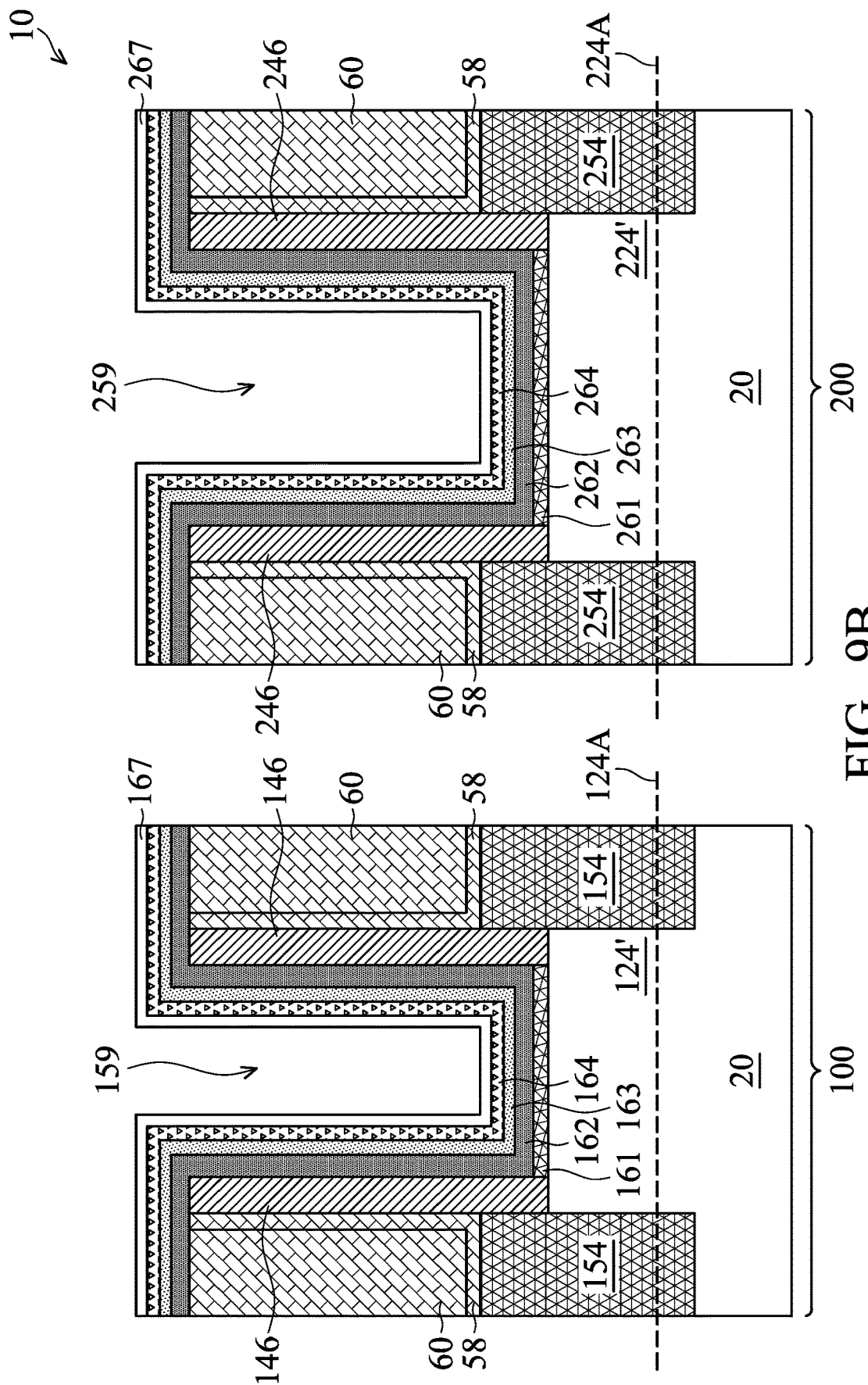

FIGS. 9B and 10B illustrate the formation of hard masks 164 and 264 and adhesion layers 167 and 267 in accordance with alternative embodiments. Hard masks 164 and 264 in accordance with these embodiments may be single-layer hard masks as shown in FIG. 9A, or may be dual-layer hard masks (as discussed subsequently referring to FIG. 18). The candidate material of hard masks 164 and 264 are thus not repeated. In accordance with some embodiments, as shown in FIG. 9B, after the formation of hard masks 164 and 264, adhesion layer 167 is formed, for example, through gas-phase deposition or coating. In accordance with some embodiments, adhesion layer 167 is formed of a non-metal-containing material such as Hexamethyldisiloxane (HMDS). The formation of the HDMS layer may be performed using a bubbler to generate gas-phase HMDS, which is conducted into a chamber in which wafer 10 is located, and a HMDS layer is deposited on hard masks 164 and 264. At the same time HMDS is deposited, nitrogen ($N_2$) may be conducted to wafer 10. The deposition of the HMDS layer may be performed at a temperature in a range between about 60° C. and about 150° C. In accordance with alternative embodiments, liquid-phase HMDS is spun on hard masks 164 and 264 to form the HMDS layer. The adhesion layer 167 is used to improve the adhesion of hard mask 164 and the overlying etching mask (such as photo resist) 165.

In FIG. 10B, etching mask 165 is coated on adhesion layer 167 and 267. Etching mask 165 includes a first portion overlapping adhesion layer 167 and a second portion overlapping adhesion layer 267. The etching mask is then patterned to remove the portion overlapping adhesion layer 267. Adhesion layer 267 is also removed, and the resulting structure is shown in FIG. 10B. The subsequent processes are essentially the same as shown in FIGS. 11, 12, 13A, 14-16, 17A, and 17B, and are not repeated.

Figure 13B:
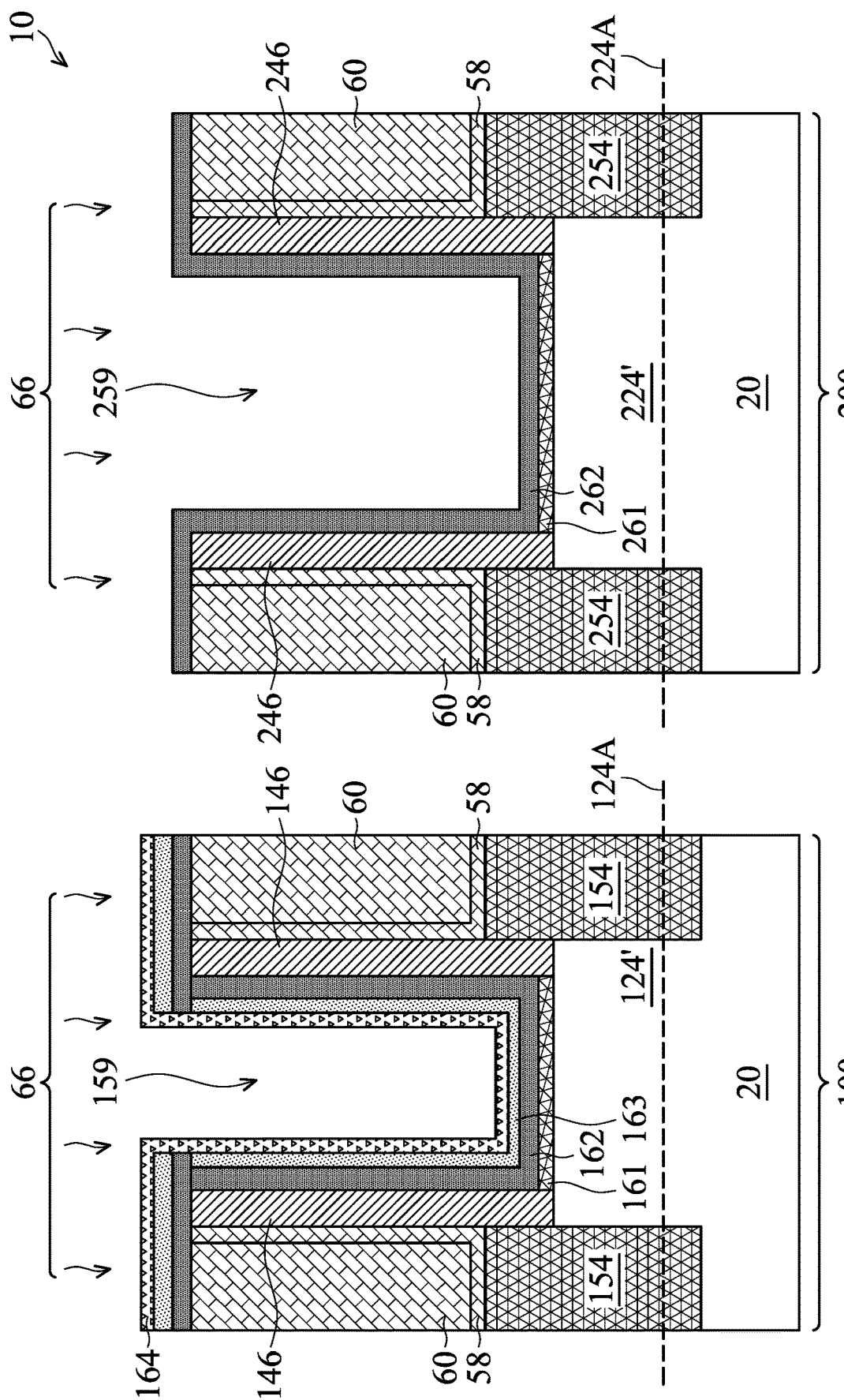

FIG. 13B illustrates an intermediate structure in the formation of the transistors in accordance with alternative embodiments. In accordance with some embodiments, the drive-in anneal process 66, instead of being performed after the removal of hard mask 164, is performed before the removal of hard mask 164. An advantageous feature of having hard mask 164 covering doping-metal-containing layer 163 during the drive-in anneal process 66 is that hard mask 164 may prevent undesirable elements such as free oxygen from being carried downwardly along with the diffused metals to the underlying fins. This prevents the undesirable growth of the ILs on the fins.

FIGS. 18 through 21 illustrate the cross-sectional views of intermediate stages in the threshold voltage tuning in accordance with some embodiments of the present disclosure. Unless specified otherwise, the materials and the formation processes of the components in these embodiments are essentially the same as the like components, which are denoted by like reference numerals in the preceding embodiments shown in FIGS. 1-6, 7A, 7B, 8A, 8B, 9A, 9B, 10A, 10B, 11, 12, 13A, 13B, 14, 15, 16, 17A and 17B. The details regarding the formation processes and the materials of the components shown in FIGS. 18 through 21 may thus be found in the discussion of the preceding embodiments.

Figure 18:
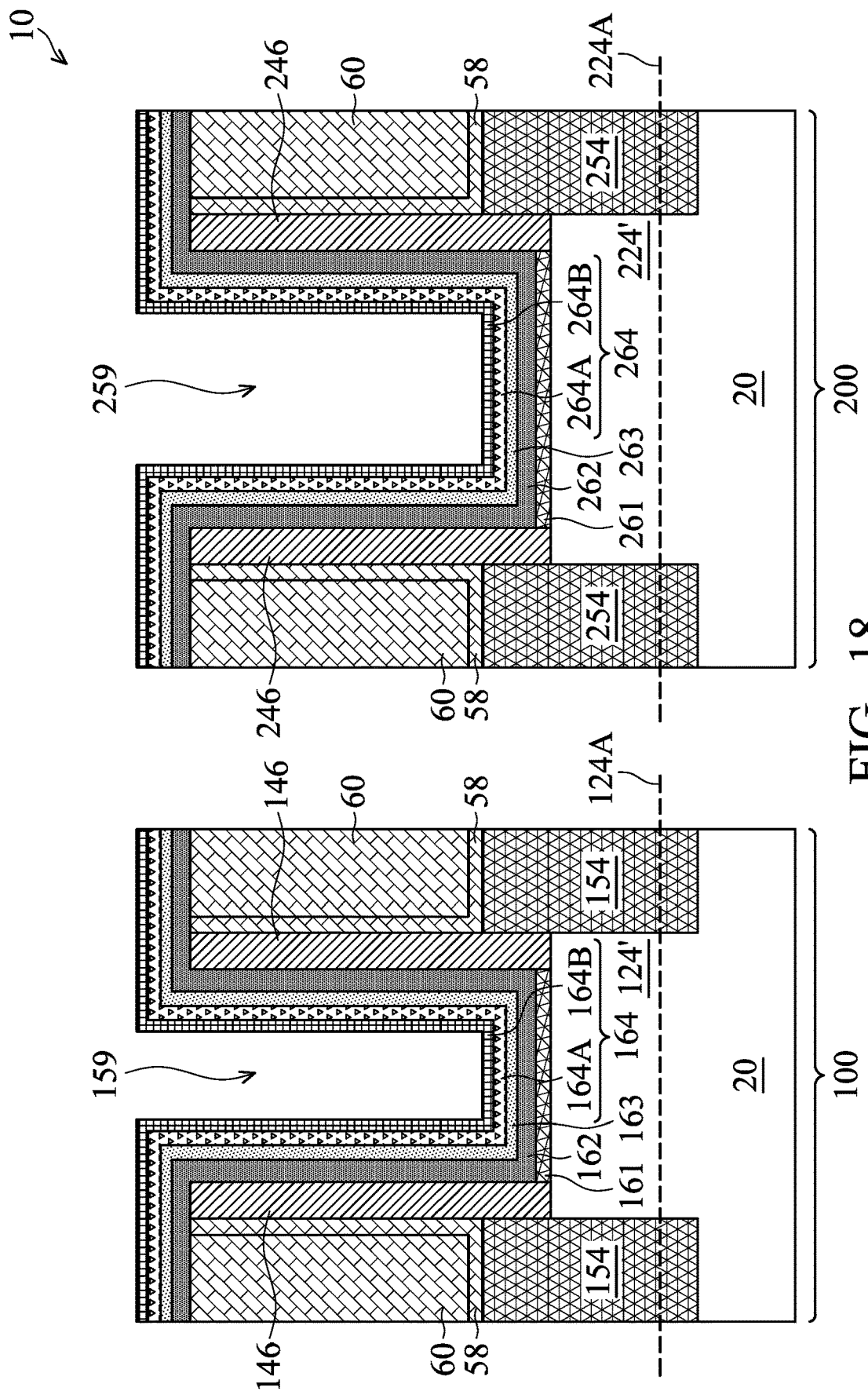
FIGS. 18 through 21 illustrate the cross-sectional views of intermediate stages in the formation of FinFETs in accordance with some embodiments.

The initial steps of these embodiments are essentially the same as shown in FIGS. 1-6, 7A, 7B, 8A, and 8B. Next, as shown in FIG. 18, trenches 159 and 259 are formed. ILs 161 and 261, high-k dielectric layers 162 and 262, doping-metal-containing layers 163 and 263, and hard masks 164 and 264 are formed. Hard masks 164 and 264 are dual-layer hard masks, with hard mask 164 comprising hard mask sub-layers 164A and 164B, and hard mask 264 comprising hard mask sub-layers 264A and 264B. In accordance with some embodiments, hard mask sub-layers 164A and 264A are formed of or comprise AlN, $Al_2O_3$, $ZrO_2$, or the like. Hard mask sub-layers 164B and 264B are formed of a material different from the material of hard mask sub-layers 164A and 264A. The adhesion of hard mask sub-layers 164B and 264B to the overlying etching mask 165 (FIG. 19) is better than the adhesion between hard mask sub-layers 164A and 264A and etching mask 165, so that hard mask sub-layers 164B and 264B may act as adhesion layers. In accordance with some embodiments, hard mask sub-layers 164B and 264B are free from titanium and tantalum. For example, hard mask sub-layers 164B and 264B may be formed of a tungsten-containing material such as WN, WC, WCN, W, or the like. The selected material of hard mask sub-layers 164B and 264B, such as tungsten, is less prone to the diffusion into the underlying layers to form undesirable intermixing layer with doping-material containing layers 163 and 263. The intermixing layer is difficult to remove, and its removal may adversely cause the excess loss of high-k dielectric layers 162 and 262. Also, the selected material of hard mask sub-layers 164B and 264B is less prone to carrying oxygen to fins 124' and 224' and causing the undesirably increase in the thicknesses of interfacial layers.

Figure 19:
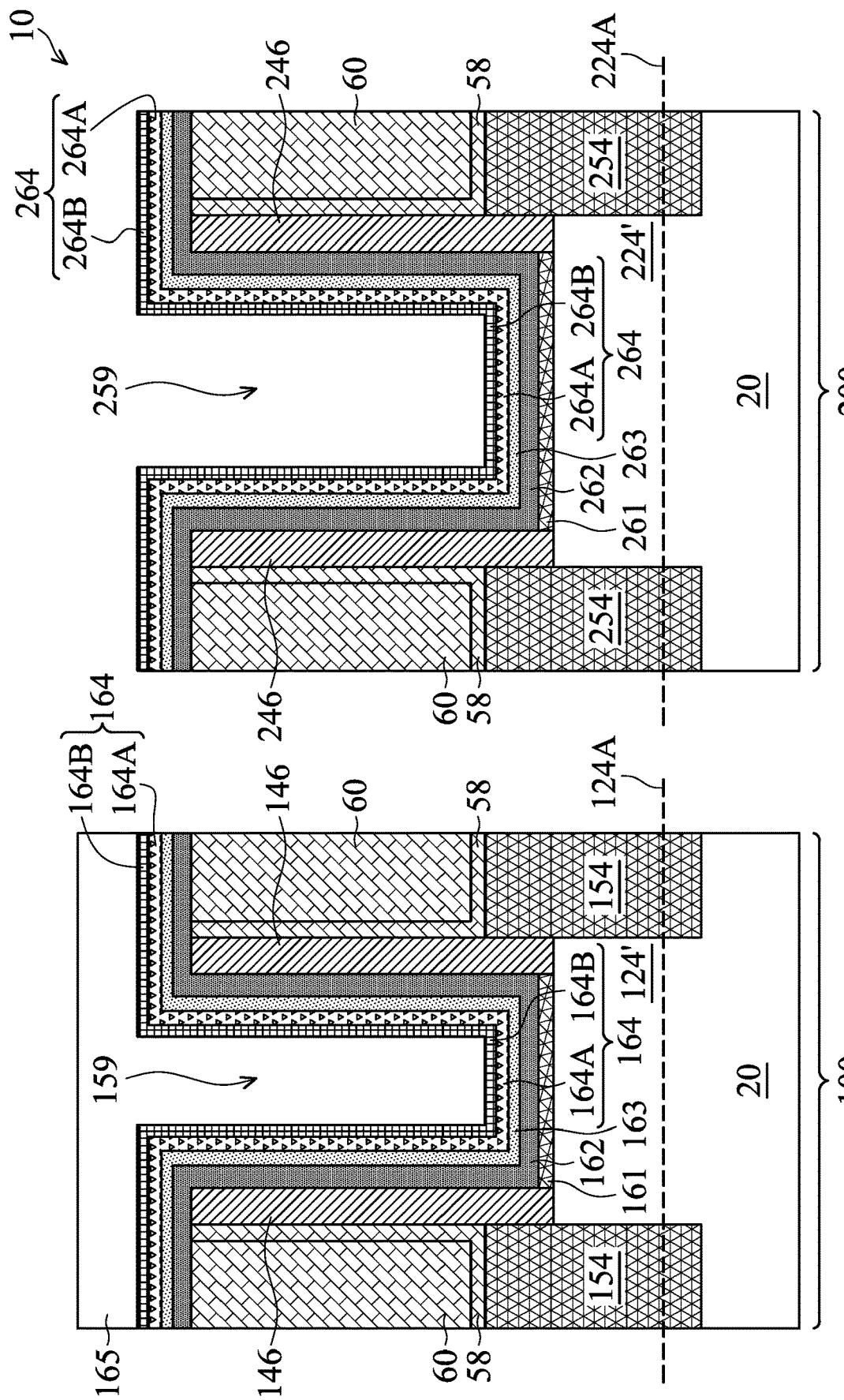

FIG. 19 illustrates the formation and the patterning for forming etching mask 165, which may be a single layer, a double-layer, or a tri-layer. Hard mask 264 is exposed through the patterned etching mask 165. Since hard masks 164B and 264B have good adhesion to etching mask 165 (for example, photo resist), the possibility of the peeling between etching mask 165 to the underlying hard mask 264 is reduced. Accordingly, there are more candidate materials of etching mask 165 to select from. For example, the materials of etching mask 165 with contact angles greater than, equal to, or smaller than 10 degrees may be used.

Figure 20:
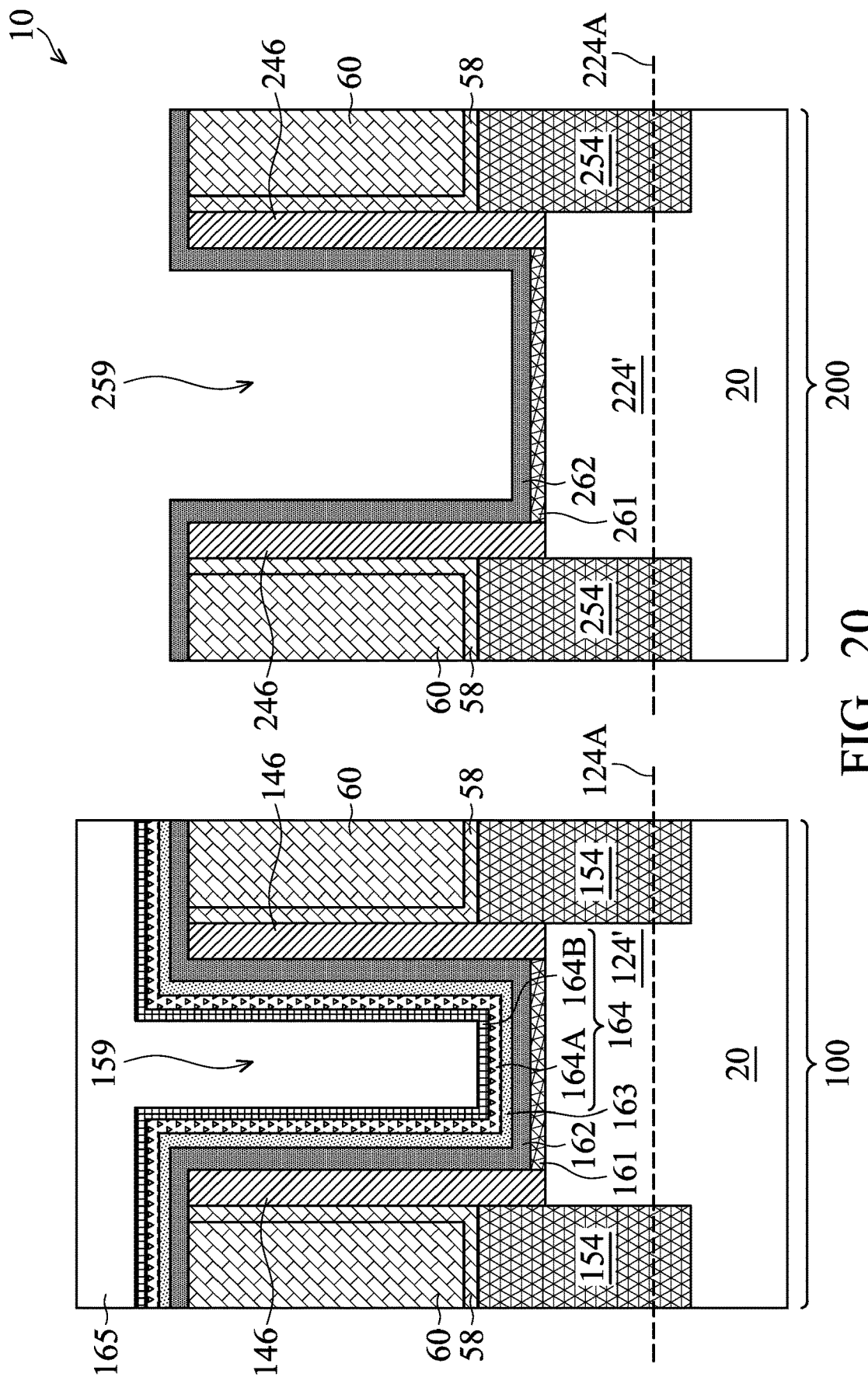

Next, hard mask 264 is removed in an etching process, followed by the etching of doping-metal-containing layer 263, so that the high-k dielectric layer 262 is exposed. The etching chemical of hard mask sub-layer 264A is selected according to its material. The etching chemical of hard mask sub-layer 264A may be selected from the similar candidate materials for removing hard mask 264 as shown in FIG. 10A. The resulting structure is shown in FIG. 20.

Figure 21:
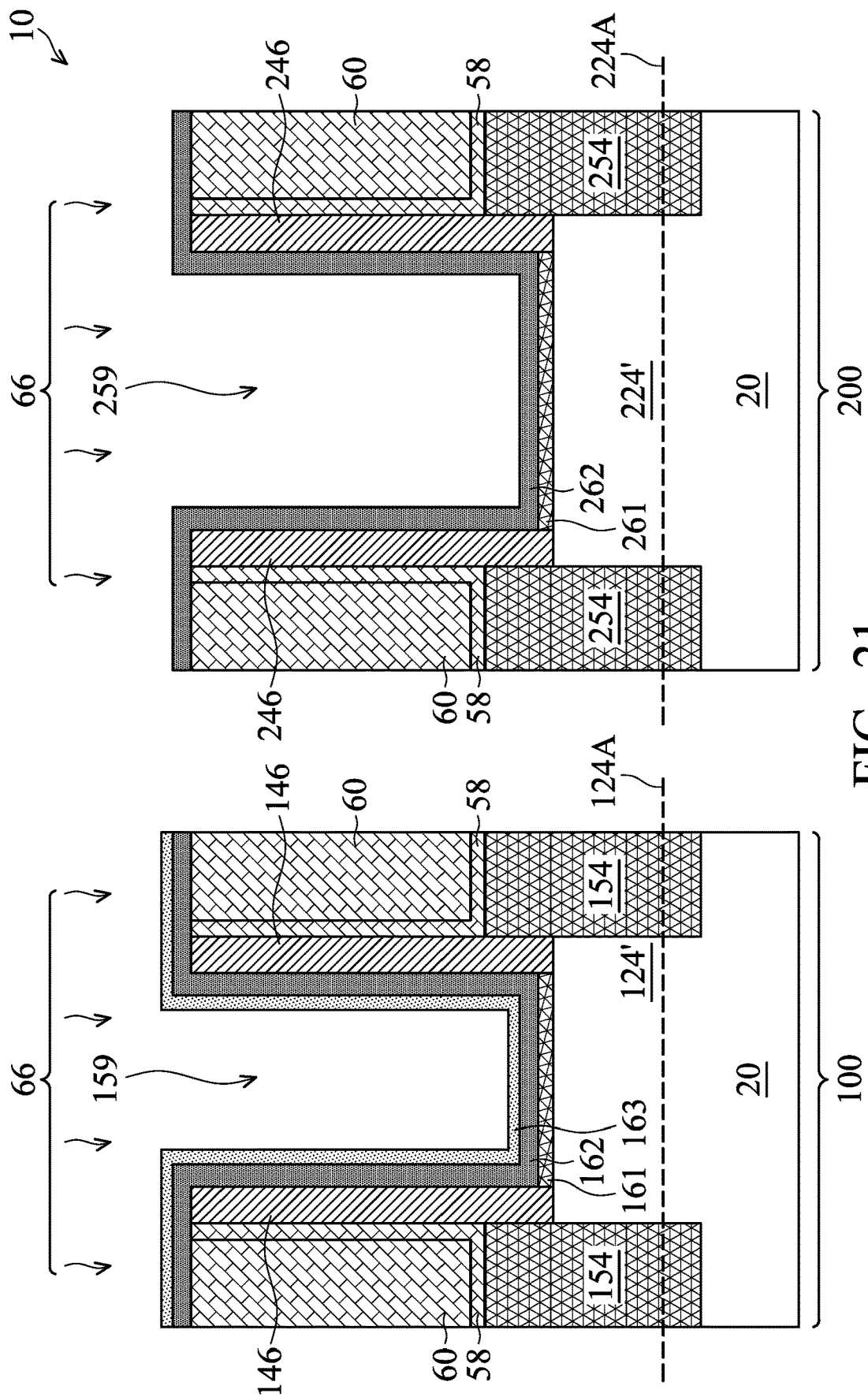

FIG. 21 illustrates the removal of etching mask 165 and hard mask 164. The subsequent processes and the corresponding structures are essentially the same as shown in FIGS. 13-16, 17A, and 17B, and are not repeated herein.

The embodiments of the present disclosure have some advantageous features. The single hard mask layer has stable properties, and does not adversely increase IL regrowth or affect the threshold-voltage tuning ability. The single hard mask layer, however, has low adhesion to photo resists, BARC, etc., and peeling may occur. If a dual hard mask is formed using some undesirable materials, for example, comprising titanium or tantalum, these metals are prone to diffusing into the doping-metal-containing layer to form a hard intermixing layer, which is difficult to remove, and its removal may cause too much loss in high-k dielectric layer. These metals, when diffuse into high-k dielectric layer, also cause the ability of tuning threshold voltage to be reduced. Furthermore, these metals are prone to carrying free oxygen to the fins, and causes excess regrowth of ILs. In the embodiments of the present disclosure, a single hard mask may be used, which does not suffer from the problems as aforementioned. The peeling problem is solved by selecting appropriate etching mask materials. Furthermore, dual hard masks may also be adopted when appropriate materials are used.

In accordance with some embodiments of the present disclosure, a method includes forming a first gate dielectric and a second gate dielectric over a first semiconductor region and a second semiconductor region, respectively; depositing a lanthanum-containing layer comprising a first portion and a second portion overlapping the first gate dielectric and the second gate dielectric, respectively; depositing a hard mask comprising a first portion and a second portion overlapping the first portion and the second portion of the lanthanum-containing layer, respectively, wherein the hard mask is free from both of titanium and tantalum; forming a patterned etching mask to cover the first portion of the hard mask, with the second portion of the hard mask being exposed; removing the second portion of the hard mask and the second portion of the lanthanum-containing layer; and performing an anneal to drive lanthanum in the first portion of the lanthanum-containing layer into the first gate dielectric. In an embodiment, the method further comprises before the anneal, removing the patterned etching mask; and removing the first portion of the hard mask. In an embodiment, the hard mask is a single-layer hard mask. In an embodiment, the forming the patterned etching mask comprises dispensing a material over and contacting the hard mask, wherein the material and the hard mask have a contact angle smaller than about 10 degrees. In an embodiment, the hard mask is a dual-layer hard mask comprising a first sub-layer comprising aluminum nitride, aluminum oxide, or zirconium oxide; and a second sub-layer over the first sub-layer, wherein the second sub-layer comprises tungsten. In an embodiment, the removing the second portion of the lanthanum-containing layer is performed using a chemical solution comprising hydrogen chloride, and the chemical solution is free from hydrogen peroxide therein. In an embodiment, the method further comprises, after the anneal, removing the first portion of the lanthanum-containing layer. In an embodiment, the method further comprises forming a titanium nitride comprising layer comprising a first portion and a second portion over and contacting the first gate dielectric and the second gate dielectric, respectively. In an embodiment, the method further comprises removing dummy gate stacks to form a first trench between first gate spacers and a second trench between second gate spacers, wherein the first gate dielectric and the second gate dielectric extend into the first trench and the second trench, respectively. In an embodiment, the depositing the lanthanum-containing layer comprises depositing a lanthanum oxide layer.

In accordance with some embodiments of the present disclosure, a method includes depositing a doping-metal-containing layer comprising a first portion over a first gate dielectric; depositing a hard mask comprising a first portion over and contacting the first portion of the doping-metal-containing layer, wherein an entirety of the hard mask is formed of a homogenous material; forming an etching mask comprising a first portion over and contacting the first portion of the hard mask; performing an anneal process to drive a dopant in the doping-metal-containing layer into the first gate dielectric; and removing the doping-metal-containing layer. In an embodiment, the forming the etching mask comprises dispensing a photo resist over and contacting the hard mask, with a contact angle between the photo resist and the hard mask being smaller than about 10 degrees. In an embodiment, the method further comprises removing the etching mask before the anneal process. In an embodiment, the method further comprises removing the hard mask before the anneal process. In an embodiment, the doping-metal-containing layer further comprises a second portion over a second gate dielectric, the hard mask further comprises a second portion over the second portion of the doping-metal-containing layer, and the method further comprises, before the anneal process, removing the second portion of the hard mask; and before the anneal process, removing the second portion of the doping-metal-containing layer. In an embodiment, the depositing the hard mask comprises depositing an aluminum oxide layer.

In accordance with some embodiments of the present disclosure, a method includes removing a dummy gate stack to form a trench between gate spacers; forming a high-k dielectric layer extending into the trench; depositing a lanthanum oxide layer over the high-k dielectric layer; depositing a hard mask over the lanthanum oxide layer, wherein the hard mask is a single-layer hard mask; forming a patterned photo resist over and contacting the hard mask; patterning the hard mask and the lanthanum oxide layer; removing the hard mask; removing the lanthanum oxide layer; and forming a gate electrode over and contacting the high-k dielectric layer. In an embodiment, the method further comprises, after the removing the hard mask and before the removing the lanthanum oxide layer, performing an anneal process to drive lanthanum into the high-k dielectric layer. In an embodiment, the anneal process comprises a spike anneal process performed at a temperature in a range between about 570° C. and about 750° C. In an embodiment, the removing the lanthanum oxide layer is performed using a chemical solution comprising ammonia and hydrogen chloride dissolved therein, wherein the chemical solution is free from hydrogen peroxide therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first gate dielectric and a second gate dielectric over a first semiconductor region and a second semiconductor region, respectively;
   depositing a lanthanum-containing layer comprising a first portion and a second portion overlapping the first gate dielectric and the second gate dielectric, respectively;
   depositing a hard mask comprising a first portion and a second portion overlapping the first portion and the second portion of the lanthanum-containing layer, respectively, wherein the hard mask is free from both of titanium and tantalum;
   forming a patterned etching mask to cover the first portion of the hard mask, with the second portion of the hard mask being exposed;
   removing the second portion of the hard mask and the second portion of the lanthanum-containing layer; and
   performing an anneal to drive lanthanum in the first portion of the lanthanum-containing layer into the first gate dielectric.

2. The method of claim 1 further comprising:
   before the anneal, removing the patterned etching mask; and
   removing the first portion of the hard mask.

3. The method of claim 1, wherein the hard mask is a single-layer hard mask.

4. The method of claim 1 further comprising, before the forming the patterned etching mask, performing a plasma treatment on the hard mask.

5. The method of claim 1, wherein the hard mask is a dual-layer hard mask comprising:
   a first sub-layer comprising aluminum nitride, aluminum oxide, or zirconium oxide; and
   a second sub-layer over the first sub-layer, wherein the second sub-layer comprises tungsten.

6. The method of claim 1 further comprising forming a non-metal-containing adhesion layer over and contacting the hard mask.

7. The method of claim 1 further comprising:
   after the anneal, removing the first portion of the lanthanum-containing layer.

8. The method of claim 7 further comprising:
   forming a titanium nitride comprising layer comprising a first portion and a second portion over and contacting the first gate dielectric and the second gate dielectric, respectively.

9. The method of claim 1 further comprising:
   before the forming the first gate dielectric and the second gate dielectric, forming a first dummy gate stack between first gate spacers and a second dummy gate stack between second gate spacers; and
   removing the first dummy gate stack and the second dummy gate stack to form a first trench between the first gate spacers and a second trench between the second gate spacers, wherein the first gate dielectric and the second gate dielectric are formed to extend into the first trench and the second trench, respectively.

10. The method of claim 1, wherein the depositing the lanthanum-containing layer comprises depositing a lanthanum oxide layer.

11. A method comprising:

forming a first gate dielectric and a second gate dielectric over a first semiconductor region and a second semiconductor region, respectively;

depositing a lanthanum-containing layer comprising a first portion and a second portion overlapping the first gate dielectric and the second gate dielectric, respectively;

depositing a hard mask comprising a first portion and a second portion overlapping the first portion and the second portion of the lanthanum-containing layer, respectively, wherein the hard mask is free from both of titanium and tantalum;

forming a patterned etching mask to cover the first portion of the hard mask, with the second portion of the hard mask being exposed;

removing the second portion of the hard mask and the second portion of the lanthanum-containing layer;

performing an anneal to drive lanthanum in the first portion of the lanthanum-containing layer into the first gate dielectric; and after the anneal, removing the first portion of the lanthanum-containing layer.

12. The method of claim 11 further comprising, at a time after the second portion of the hard mask is removed and before the anneal, removing the first portion of the hard mask.

13. The method of claim 11 further comprising, at a time after the anneal and before the first portion of the lanthanum-containing layer is removed, removing the first portion of the hard mask.

14. The method of claim 11 further comprising dispensing a photo resist over and contacting the hard mask, with a contact angle between the photo resist and the hard mask being smaller than about 10 degrees.

15. The method of claim 11 further comprising removing the patterned etching mask before the anneal.

16. The method of claim 11 further comprising removing the first portion of the hard mask before the anneal.

17. The method of claim 11 further comprising forming a work-function layer over each of the first gate dielectric and the second gate dielectric.

18. A method comprising:

forming a first gate dielectric and a second gate dielectric over a first semiconductor region and a second semiconductor region, respectively, wherein both of the first gate dielectric and the second gate dielectric comprise a lanthanum oxide;

depositing a lanthanum-containing layer comprising a first portion and a second portion overlapping and in physical contact with the first gate dielectric and the second gate dielectric, respectively;

depositing a hard mask comprising a first portion and a second portion overlapping the first portion and the second portion of the lanthanum-containing layer, respectively, wherein the hard mask is free from both of titanium and tantalum;

forming a patterned etching mask to cover the first portion of the hard mask, with the second portion of the hard mask being exposed;

removing the second portion of the hard mask and the second portion of the lanthanum-containing layer; and performing an anneal to drive lanthanum in the first portion of the lanthanum-containing layer into the first gate dielectric.

19. The method of claim 18, wherein the anneal comprises a spike anneal process performed at a temperature in a range between about 570° C. and about 750° C.

20. The method of claim 18 further comprising, after the anneal, removing the first portion of the lanthanum-containing layer by exposing the first portion of the lanthanum-containing layer to a chemical solution comprising ammonia and hydrogen chloride dissolved therein, wherein the chemical solution is free from hydrogen peroxide therein.

* * * * *